(12) United States Patent
Bokhari et al.

(10) Patent No.: US 10,664,310 B2
(45) Date of Patent: May 26, 2020

(54) MEMORY ACCESS OPTIMISATION USING PER-LAYER COMPUTATIONAL MAPPING AND MEMORY ALLOCATION FOR CNN APPLICATION

(71) Applicant: CANON KABUSHIKI KAISHA, Tokyo (JP)

(72) Inventors: Haseeb Bokhari, Kingsford (AU); Jorgen Peddersen, Kensington (AU); Sridevan Parameswaran, Kensington (AU); Iftekhar Ahmed, Lane Cove North (AU); Yusuke Yachide, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/221,232

(22) Filed: Dec. 14, 2018

(65) Prior Publication Data

US 2019/0187963 A1     Jun. 20, 2019

(30) Foreign Application Priority Data

Dec. 19, 2017   (AU) .................................. 2017279610

(51) Int. Cl.
*G06F 9/48* (2006.01)
*G06F 8/41* (2018.01)
(Continued)

(52) U.S. Cl.
CPC ............. *G06F 9/4881* (2013.01); *G06F 8/35* (2013.01); *G06F 8/433* (2013.01); *G06F 8/443* (2013.01);
(Continued)

(58) Field of Classification Search
CPC . G06F 8/35; G06F 8/433; G06F 8/443; G06F 9/4881; G06F 9/5038; G06F 17/5045; G06N 3/02
(Continued)

(56) References Cited

U.S. PATENT DOCUMENTS

| 2010/0088490 | A1* | 4/2010 | Chakradhar | .............. G06F 8/45 712/34 |
| 2010/0214936 | A1* | 8/2010 | Ito | ...................... G06K 9/00986 370/252 |

(Continued)

FOREIGN PATENT DOCUMENTS

AU   2016228166 A   9/2016

OTHER PUBLICATIONS

Chen, T., et al, "DianNao: A Small-Footprint High-Throughout Accelerator for Ubiquitous Machine-Learning", ASPLOS 14, Mar. 1-5, 2014, pp. 269-284. (Year: 2014).*

(Continued)

*Primary Examiner* — Qing Chen
(74) *Attorney, Agent, or Firm* — Canon U.S.A., Inc., IP Division

(57) ABSTRACT

A method of configuring a System on Chip to execute a CNN process comprising CNN layers, the method comprising, for each schedule: determining memory access amount information describing how many memory accesses are required; expressing the memory access amount information as relationships describing reusability of data; combining the relationships with a cost of writing and reading from external memory, to form memory access information; determining a memory allocation for on-chip memory of the SoC for the input FMs and the output FMs; and determining, dependent upon the memory access information and the memory allocation for each schedule; a schedule which minimises (Continued)

the memory access information of external memory access for the CNN layer of the CNN process; and a memory allocation associated with the determined schedule.

16 Claims, 21 Drawing Sheets

(51) Int. Cl.
  *G06N 3/02* (2006.01)
  *G06F 8/35* (2018.01)
  *G06F 9/50* (2006.01)
  *G06F 17/50* (2006.01)

(52) U.S. Cl.
  CPC ........ *G06F 9/5038* (2013.01); *G06F 17/5045* (2013.01); *G06N 3/02* (2013.01)

(58) Field of Classification Search
  USPC ..... 718/102, 103; 717/151–161; 706/15, 16, 706/19
  See application file for complete search history.

(56) References Cited

U.S. PATENT DOCUMENTS

| | | | | |
|---|---|---|---|---|
| 2011/0239032 | A1* | 9/2011 | Kato | G06F 17/15 713/500 |
| 2017/0344882 | A1* | 11/2017 | Ambrose | G06F 3/0604 |
| 2018/0136912 | A1* | 5/2018 | Venkataramani | G06F 8/35 |
| 2018/0189981 | A1* | 7/2018 | Singh | G06T 9/002 |
| 2018/0293490 | A1* | 10/2018 | Ma | G06N 3/0445 |
| 2018/0293691 | A1* | 10/2018 | Nurvitadhi | G06F 9/3001 |
| 2018/0293777 | A1* | 10/2018 | Sarel | G06N 3/0454 |
| 2018/0299841 | A1* | 10/2018 | Appu | G05B 13/027 |
| 2018/0314926 | A1* | 11/2018 | Schwartz | G06N 3/063 |
| 2019/0066257 | A1* | 2/2019 | Daga | G06T 1/60 |
| 2019/0102671 | A1* | 4/2019 | Cohen | G06N 3/08 |

OTHER PUBLICATIONS

Karnowski, J., "AlexNet visualization", <https://jeremykarnowski.wordpress.com/2015/07/15/alexnet-visualization/>, Accessed on Apr. 19, 2017. (Year: 2017).*

Krizhevsky, A., et al, "ImageNet Classification with Deep Convolutional Neural Networks", Advances in Neural Information Processing Systems 25, Proceedings from NIPS, Dec. 2012, pp. 1106-1114. (Year: 2012).*

Peemen, M., et al, "Inter-Tile Reuse Optimization Applied to Bandwidth Constrained Embedded Accelerators", Design, Automation & Test in Europe Conference & Exhibition (DATE), 2015, pp. 169-174. (Year: 2015).*

Peemen, M., et al, "Memory-Centric Accelerator Design for Convolutional Neural Networks", Proceedings from ICCD, IEEE, Oct. 2013, pp. 13-19. (Year: 2013).*

Zhang, C., et al, "Optimizing FPGA-based Accelerator Design for Deep Convolutional Neural Networks", proceedings from FPGA, Feb. 22-24, 2015, pp. 161-170. (Year: 2015).*

* cited by examiner

MEMORY ACCESS OPTIMISATION USING PER-LAYER COMPUTATIONAL MAPPING AND MEMORY ALLOCATION FOR CNN APPLICATION

TECHNICAL FIELD

The present invention relates to automation tools for designing digital hardware systems in the electronics industry and, in particular, to the mapping of Convolutional Neural Network (CNN) processes into a multi-accelerator System-on-Chip (also referred to as a multi-processing-unit System-on-Chip) (SoC) based architecture.

BACKGROUND

Machine Learning (ML) has progressed by leaps and bounds in the last decade. Researchers are especially interested in applying the concepts of ML to solve the problem of object recognition. Many of the proposed machine-learning solutions are inspired by the complex neural processing capability of the human brain. A CNN (also referred to as a CNN process) described hereinafter in more detail with reference to FIG. 13, is an example of such a system which has exhibited human like accuracy in relation to object recognition. CNNs are typically depicted in the form of interconnected layers of feature maps (eg 1304 and 1305 in FIG. 13) and can be implemented using interconnected Processing Units ie PUs (also referred to as Processing Elements ie PEs or "accelerators") which can, for example, be fabricated on a System on Chip (SoC) such as 1314 (also referred to as a CNN accelerator SoC) in FIG. 13. Given the aforementioned high accuracy, CNNs have been used in some cutting-edge applications such as video surveillance, autonomous driving/navigation and large scale image search engines. It is anticipated that CNN processes will be part of various embedded system products such as digital single-lens reflex (DSLR) cameras, mobile phones and other handheld products.

CNNs emulate the human neural system by processing input image data through interconnected layers. The layers use pre-determined coefficients to transform the input data, thus extracting specific features from the image. The number of coefficients and the amount of intermediate data (i.e. data produced at the output of each layer) can be very large, thus making the execution of CNN processes both computationally and memory intensive. Exacerbating this issue is the fact that in order to improve the accuracy of CNNs even further, researchers have proposed using deep learning algorithms that use even higher numbers of layers.

Research studies have shown that general purpose computing machines are not efficient for implementing CNN processes. Graphical Processing Units (GPUs) are a strong candidate for implementing CNN processes because GPUs, which are suitable for parallel computation, are well adapted to exploit the high level of data parallelism typically present in CNN processes. However, GPUs are not suitable for integration in low-power, low-cost embedded systems. Therefore, researchers have proposed various application-specific accelerators for use as PUs when implementing CNN processes, proposing both Field Programmable Gate Array (FPGA) and Application Specific Integrated Circuit (ASIC) based multi-accelerator implementations.

However, as with all embedded systems, designers are challenged to maximise the performance of these accelerators, while adhering to area, power and other design constraints. Typical SoCs designed with CNN accelerators contain a number of processing units (PUs). The SoC may also have an associated on-chip shared memory module whose storage capacity is shared by the PUs in the SoC. Because of the large volume of data involved in CNN processing, the SoC is also typically interfaced with external memory such as DRAM. The cost (both in terms of energy and execution time) of accessing an external memory is much higher than accessing an on-chip shared memory. Therefore, it is often required to maximise the use of on-chip shared memory while minimizing the accesses made to an external memory.

CNN Process

FIG. 13 depicts an example 1300 of how CNN processes may be used in the applications referred to above, in order to introduce terminology used in the present description. In the example 1300 it is desired to process an image 1302 in order to extract a number of features using a CNN process 1303.

The CNN process 1303 (also referred to simply as a CNN) is made up of a number of layers 1304, 1305, . . . , 1306 of feature maps (FMs) such as 1316. Feature maps in each layer are interconnected, as depicted by an arrow 1317, to feature maps of a subsequent layer (the number of connections depends on the specific CNN process). For example, in one CNN process, all the feature maps in a layer are connected to all the feature maps of a subsequent layer. In a different CNN process, however, the top half of the features maps in a layer are connected to all the top half feature maps of a subsequent layer, and the bottom half of the feature maps in the layer are connected to all the bottom half features maps of the subsequent layer. The CNN process 1303 has N layers, the last (i.e. Nth) of which produces the desired outputs 1307.

A CNN implementation 1301 (also referred to as a CNN procedure) comprises a sequence of process steps which, when embodied on (ie programmed onto) a multi-accelerator SoC device or platform such as 1314 for example, executes the processing operation represented by the CNN 1303 in order to produce the outputs 1307 from the input 1302. In order to embody the CNN implementation 1301 on the SoC 1314 it is necessary to generate, as depicted by an arrow 1319, based upon the CNN implementation 1301 and applicable memory operations based on the memory architecture of the SoC platform 1314, a set 1308 of predetermined scheduling schemes (also known as schedulers or schedules) each of which is mapped to (i.e. is identified as being suitable for or even optimal for use in executing) a respective PU of the SoC 1314. Thus for example, in FIG. 13 the scheduling scheme 1322 is mapped, as depicted by a dashed arrow 1323, to the processing unit (PU) 1311 of the SoC indicating that the PU 1311 of the SoC executes the scheduling scheme 1322 as indicated by the mapping 1323.

Accordingly, a scheduling scheme such as 1322 maps its set of operations to an available PU such as 1311 which processes input data (such as the feature maps in the layer 1304) in parallel and produces output feature maps (such as the feature maps in the layer 1305). Neighbouring layers of the CNN process (such as 1304, 1305) are, in one example, processed sequentially. That is, one layer of the CNN process (such as 1304) is received as an input, processed by the PUs (such as 1311, 1312, 1313, . . . , 1321) of the SoC 1314 in accordance with the appropriate scheduling schemes 1308, which will then produce feature maps of the next layer of CNN process as output (such as 1305). The produced layer (such as 1305) is then used as an input to generate feature maps of the subsequent layer (such as 1306) of the CNN process using the available set of PUs in the SoC 1314.

The SoC 1314 is made up of a number of processing units (PUs) such as 1311, 1312, . . . , 1313 and 1321. PUs in the SoC can be connected in any fashion or not connected at all (an example platform is depicted in 1314 where the PUs are connected with a forward link to the subsequent PUs). In general, there need be no correspondence between the number of layers in the CNN 1303 and the number of PUs in the SoC 1314. Furthermore, in general there need be no correspondence between the interconnections 1317 in the CNN 1303 and the interconnections such as 1318 in the SoC 1314. The CNN 1303 in FIG. 13 has N layers, the last (i.e. Nth) layer of which produces the desired outputs 1307.

Each PU such as 1321 may have an associated local (ie on-chip) memory module 1320 (also commonly referred to as on-chip memory or SRAM). The SoC 1314 may also have an associated on-chip shared memory module 1310 whose storage capacity is shared by the PUs in the SoC. In one embodiment, local on-chip memory modules such as 1320 may constitute distributed shared memory (SM) where the PUs 1311, 1312, 1313, 1321 may share the memory available in memory module 1320 of PU 1321. The SoC may also have an external memory module (also commonly referred to as DRAM or DDR memory) 1309 whose storage capacity is accessible by the PUs in the SoC. For the purposes of this description, the term 'on-chip memory' refers to local on-chip memory 1315, 1320 and shared on-chip memory 1310, but does not refer to external memory modules such as 1309. The term 'on-chip' and local may be used interchangeably.

The cost (both in terms of energy and execution time) of accessing the external memory module 1309 is much higher than the cost of accessing the on-chip memory module 1310. Therefore, it is often required to maximise the use of an on-chip memory module such as 1310, 1315, 1320, while minimizing the accesses made to an external memory module such as 1309. In a SoC such as 1314, the use of shared on-chip memory modules such as 1310 is specified by the programmer. For example, while processing the CNN layer 1305, the module 1310 can be used to store (a) some input data generated from the layer 1304 (which is input to the layer 1305), or (b) output data generated from layer 1305, or both. The allocation of on-chip memory modules such as 1310 to input and output data is an important design decision as it impacts both execution time and energy consumption of the SoC executing the CNN application.

As with all embedded systems, multi-accelerator designers are challenged to maximise the performance of these accelerators such as 1311, while adhering to area, power and other design constraints of the SoC 1314. The high volume of data and the large number of computational steps involved in executing a CNN implementation such as 1301 make the task of mapping the CNN implementation (such as 1301) associated with the CNN process (such as 1303) into a multi-accelerator based SoC such as 1314 even more difficult. There are numerous CNN processes such as 1303, and there are a number of ways that the CNN implementation such as 1301 associated with the CNN processes such as 1303 can be mapped to accelerator hardware such as 1314. Furthermore, the optimal allocation of an on-chip memory module such as 1310 adds another dimension to the design problem.

Scheduling schemes such as 1308, each of which specifies a sequence of computational and memory operations for executing a particular layer such as 1304 of the CNN process on an associated PU (or associated set of PUs) such as 1312 of the SoC 1314, are created 1319 based upon the CNN process 1303, for execution on the multi-accelerator SoC 1314. The operations embodied in the scheduling schemes such as 1322 are typically computation operations and/or memory operations. For example, "convolution" is a computation operation and "read from external memory into on-chip memory" is a memory operation. The memory operations in the scheduling scheme such as 1322 depend on space allocation in the on-chip memory module such as 1310. A unique combination of computation and communication sequences for executing a layer such as 1304 forms a scheduling scheme.

One known method for implementing a CNN process such as 1303 on a SoC such as 1314 is to select a particular scheduling scheme such as 1322 for the entire CNN process 1303 using design space exploration to determine the appropriate scheduling scheme. The same scheduling scheme is then applied to the PUs 1311, 1312, 1313, 1321 of the SoC. Since different layers 1304, 1305, . . . , 1306 in a CNN process are different in terms of sizes and parameters, choosing one particular scheduling scheme such as 1322 may be suboptimal.

In another known method, all possible scheduling schemes 1308 are exhaustively explored and simulated against all the layers of the CNN process 1303. This approach is time consuming and is typically not feasible within a reasonable time if the CNN process is large.

In another known method, accelerators such as 1321 are customised for each layer such as 1304 of the CNN process 1303 based on the level of unrolling and pipelining necessary to match the computation and communication demand of the CNN layer 1304. Since complex hardware structures are required to configure the accelerators such as 1321, uniform unroll factors are generally preferred for all the layers of the CNN process. Furthermore, this method only adds just enough memory to the system to act as buffer between PUs such as 1311, 1312, 1313, 1321 and an external memory module such as 1309. A disadvantage of this method is that unique hardware designs must be made for accelerators at each CNN level rather than using more generalised PUs, resulting in a large design and testing cost and increased chip area devoted to the many customised accelerators.

In another known method, loop bounds for processing the CNN process are determined based on the size of the given buffers such as 1320 in the SoC 1314, to reduce accesses to the external memory 1309. The utilised scheduling schemes have parameterisable loop bounds for each layer of the CNN process, but have the same operations sequence.

In another known method, optimal sizes for buffers such as 1309 are determined for each layer such as 1304, 1305, . . . 1306 of the CNN process using the same scheduling scheme for all the layers 1304, 1305, . . . 1306. Selecting the same schedule such as 1322 for all the layers in the CNN process is suboptimal with respect to reducing design costs such as external memory, execution time of the CNN process and the size of the on-chip memory such as 1320.

In another known method, a scheduling scheme from set of scheduling schemes such as 1308 is chosen for each CNN layer such as 1304, 1305, . . . 1306 on per layer basis such that external memory accesses are minimised. The selection of scheduling scheme for a layer, such as 1305, is dependent on a scheduling scheme selected for a previous CNN layer, such as 1304. The dependency is caused by the storage locations (such as the module 1309 or 1310) of data generated from a previous layer such as 1304, as this method selects a scheduling scheme for a layer, such as 1305, that can efficiently use the output data. The aforementioned dependency limits the set of scheduling schemes that can be applied to a certain layer such as 1304, 1305, . . . 1306.

However in this method, it is assumed that each PU has adequate local memory, such that the intra-layer external memory accesses are small compared to the memory accesses required to transform the local memory maps between layers. In cost-constrained implementations, this assumption will typically not be realised.

In another known method, different loop transformations are applied to a multi-loop computer code and some of the data arrays are assigned to an on-chip memory module, such as 1310, to reduce accesses made to external memory such as 1309. This method uses a heuristic algorithm to decide on the preference for different data arrays to be completely stored in on-chip memory module such as 1310.

Finding the best scheduling schemes 1308 and best allocation of on-chip memory modules such as 1310 and external memory 1309 for the entire CNN process 1303 in a feasible time frame is a difficult problem, and can have a significant impact on the overall design exploration time, which greatly impacts the design efficiency and time to market of the embedded system.

SUMMARY

It is an object of the present invention to substantially overcome, or at least ameliorate, one or more disadvantages of existing arrangements.

Disclosed are arrangements, referred to as Reuse Analysis and Memory Allocation Based Scheduling (RAMABS) arrangements in this description, which seek to address the above problems by determining optimal on-chip memory allocation and optimal assignment of scheduling schemes to SoC accelerators based upon reuse analysis of ordering of for-loops present in different scheduling schemes.

According to one aspect of the present invention there is provided a method of configuring a multi-processing-unit System on Chip SoC (110, 1314) to execute a CNN process comprising a plurality of CNN layers, the method comprising the steps of: receiving a plurality of predetermined schedules each specifying an order of processing steps for processing of input feature maps (input FMs) input to a CNN layer of the CNN process, and for processing output feature maps (output FMs) output from the CNN layer of the CNN process, said processing to be performed by processing units of the SoC; for each schedule: determining memory access amount information describing how many memory accesses are required to process the input FMs and the output FMs of the CNN layer; expressing the memory access amount information as one or more relationships describing an extent to which data can be reused by the processing steps of the schedule without requiring additional memory accesses; combining the relationships with a cost of writing to an external memory and a cost of reading from the external memory, to form memory access information describing a total external memory access cost required to implement the schedule; determining a memory allocation for on-chip memory of the SoC for the input FMs and the output FMs dependent upon the determined memory access information and a size of the on-chip (i.e. local) memory; and determining, dependent upon the memory access information and the memory allocation determined for each schedule of the plurality of schedules; a schedule from the plurality of schedules which minimises the memory access information of external memory access for the CNN layer of the CNN process; and a memory allocation associated with the determined schedule.

According to another aspect of the present invention, there is provided an apparatus for implementing any one of the aforementioned methods.

According to another aspect of the present invention there is provided a computer program product including a computer readable medium having recorded thereon a computer program for implementing any one of the methods described above.

In this disclosure, a framework is proposed for selecting a particular scheduling scheme and memory allocation for each CNN layer such as 1304 depending on various constraints, such that the number of external memory accesses to the external memory 1309 is minimised. The combination of CNN layers, scheduling schemes and possible memory allocation options for these layers comprise an exponential design space. Disclosed RAMABS estimation methods typically populate the design space and choose a combination of scheduling scheme and memory allocation for each CNN layer in linear time complexity. The disclosed RAMABS framework works independently of finer details of hardware, and hence it typically enables designers to quickly examine the expected memory performance in the initial stages of hardware design. The disclosed RAMABS arrangements typically result in a significant reduction in external memory accesses generated by CNN applications. For example, for the AlexNet CNN application, the disclosed RAMABS arrangements typically reduce the external memory accesses by up to 70% in some scenarios. This solution is generated by the disclosed RAMABS design space exploration arrangement which is typically over 40,000 times faster than exhaustive search.

Therefore, the focus of this disclosure is to describe a framework that can choose a scheduling scheme and devise an optimal memory allocation for each layer of a given CNN application by considering various hardware parameters and CNN application parameters. It is anticipated that future CNN accelerators will have some degree of flexibility, such that they can execute different types of CNN applications. The disclosed RAMABS framework can be used to evaluate the memory hierarchy for CNN accelerators even before finer architectural details are finalised. The present disclosure:
  formulates the problem of selecting a particular scheduling scheme and memory allocation for each CNN layer depending on various constraints and optimisation goals.
  provides estimation methods applicable to the exponential design space associated with the combination of CNN layers, scheduling schemes and possible memory allocation options for these layers. The disclosed RAMABS arrangements provide estimation methods to populate the design space and choose a suitable combination of scheduling scheme and memory allocation for each CNN layer.

Other aspects of the invention are also disclosed.

BRIEF DESCRIPTION OF THE DRAWINGS

One or more embodiments of the invention will now be described with reference to the following drawings, in which.

DETAILED DESCRIPTION INCLUDING BEST MODE

Context

Figure 1:
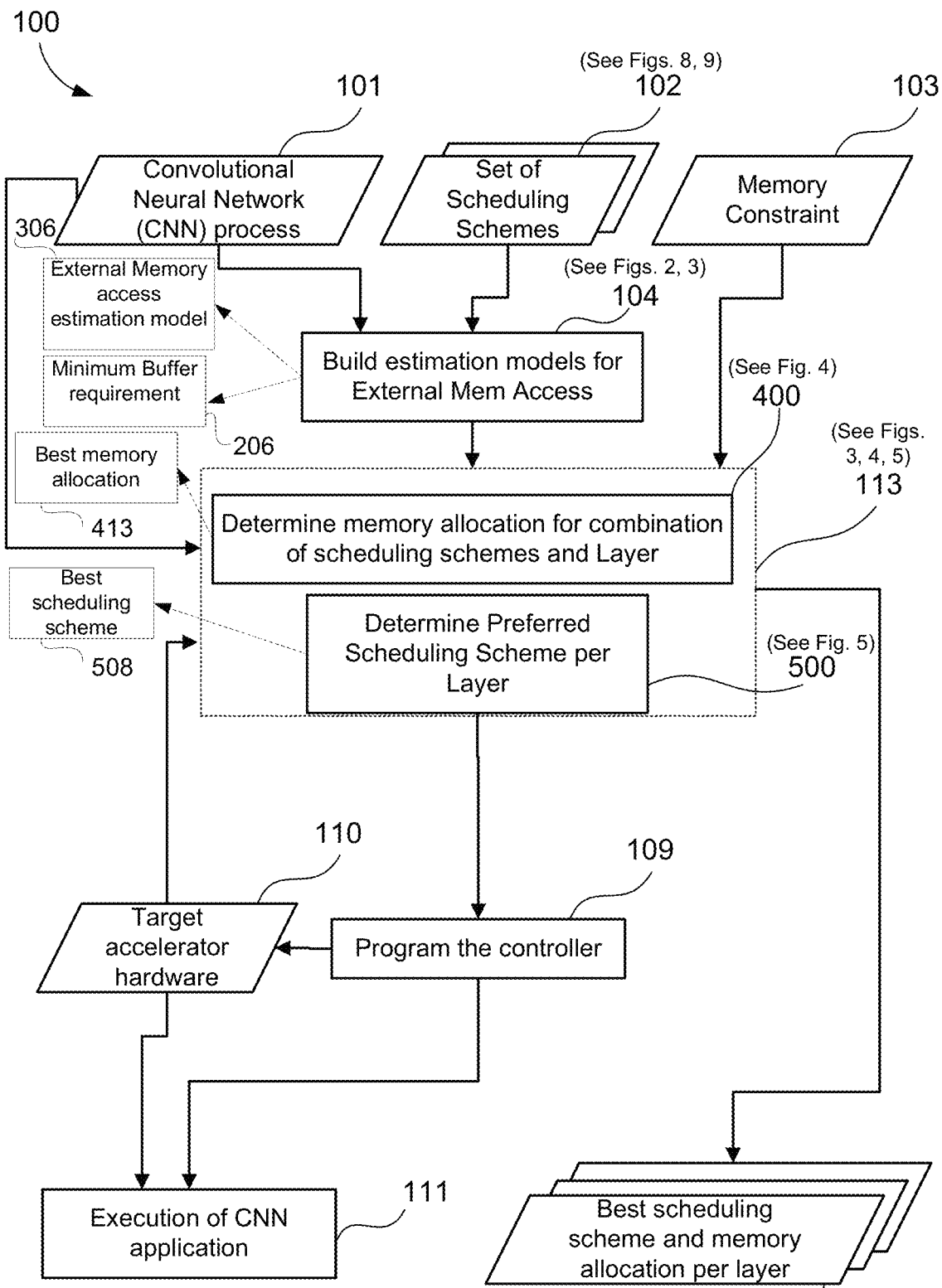
FIG. 1 is a schematic flow diagram depicting an example of a method for determining the scheduling and memory allocation schemes for a CNN process targeting particular accelerator hardware, and subsequently implementing and executing the CNN process on that hardware.

Where reference is made in any one or more of the accompanying drawings to steps and/or features, which have the same reference numerals, those steps and/or features have for the purposes of this description the same function(s) or operation(s), unless the contrary intention appears.

It is to be noted that the discussions contained in the "Background" section and the section above relating to prior art arrangements relate to discussions of documents or devices which may form public knowledge through their respective publication and/or use. Such discussions should not be interpreted as a representation by the inventors or the patent Applicant that such documents or devices in any way form part of the common general knowledge in the art.

Finding optimal or close to optimal scheduling schemes 1308 and memory allocation for each layer 1304 of the CNN process 1303 in order to execute on the SoC 1314 using simulations is time consuming. An optimal or close to optimal selection of the scheduling schemes 1308 and memory allocation for the layers 1304, 1305 and 1306 of the CNN process 1303 is expected to constitute the optimal or close to optimal mapping of the CNN process 1303 to be executed in the SoC 1314.

The optimal or close to optimal scheduling scheme 1322 and memory allocation for the particular CNN process layer 1304 is defined as the scheduling scheme and memory allocation for execution on the SoC 1314 for the layer 1304 in question which satisfies given criteria with reduced or minimal design costs. For example, optimal or close to optimal memory allocation and scheduling schemes will efficiently use the on-chip memory module (such as shared on-chip memory module 1310) and reduce or minimise the number of accesses made to the external memory module 1309, thus reducing the execution time of CNN process 1303 and the energy consumption of the SoC 1314. In order to avoid performing time-expensive simulations but still be able to find the optimal or close to optimal selection of memory allocation and scheduling schemes for layers of the CNN process, an estimation method is required in order to accurately predict the design costs, such as the required on-chip memory size, the external memory accesses and the execution time of the CNN process 1303. The disclosed RAMABS arrangements enable rapid prediction of the design costs when selecting the scheduling schemes 1308 and memory allocations for the layers 1304, 1305 . . . 1306 of the CNN process 1303, by considering the resources (such as accelerators 1311 and connectivity 1318 between accelerators) available in the given SoC 1314, so that the exploration and selection for mapping can be quickly performed with high accuracy.

Overview of the RAMABS Arrangement

A general CNN process such as 1303 typically comprises one or more stages 1324, where each stage such as 1324 can contain one or more computational layers such as (i) a Convolution Layer (such as 1304 for example), (ii) a Pooling Layer (not shown), and, (iii) a Classifier Layer (such as 1305 for example).

Convolution Layer:

A convolution layer is responsible for extracting different features from a given input image to form a feature matrix. Multiple convolutions can be used in series for higher accuracy in image detection. A pooling layer can be used after the convolution layer to reduce the size of the feature matrix (ie the output feature maps). The output from the convolution layer or the pooling layer is input to a classifier layer which identifies the image using numerical scoring. The convolution layer is most demanding in terms of execution time and memory operations. This disclosure is concerned with, but not limited to, accelerators designed for the on-line Feed Forward stage of CNN applications. The feed-forward stage refers to the fact that in the CNN 1303 in FIG. 13 the layers such as 1304, 1305 are processed in a left to right manner.

Figure 7:
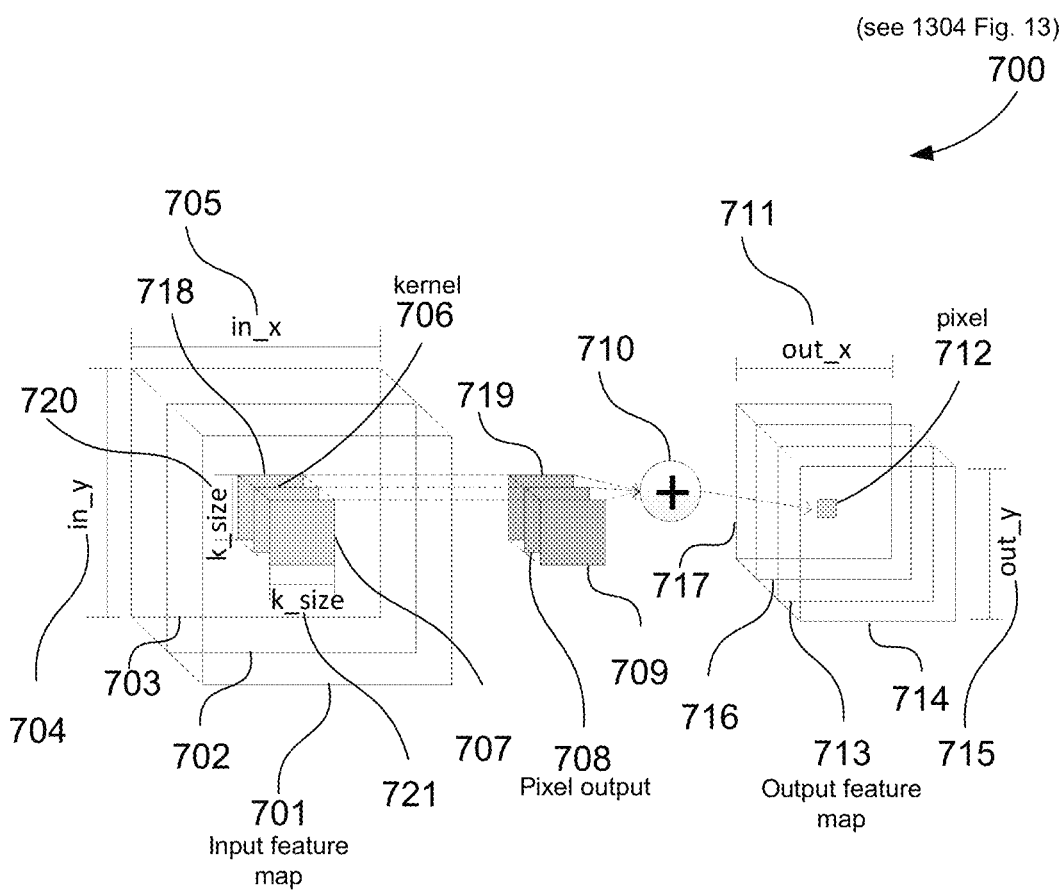
FIG. 7 is an example processing structure of neighbouring convolutional layers in a CNN process.

FIG. 7 shows the computational structure of a convolution layer 700 (see also 1304 in FIG. 13) in a Convolutional Neural Network CNN process (such as 1303). The input to the convolution layer 700 is made up of multiple two dimensional input feature maps 701, 702, 703 (referred to as "FM"s) and the output is made up of multiple output feature maps 714, 713, 716, 717. In this example the three input FMs, 701, 702 and 703 are of width in_x (705) and height in_y (704). The four output FMs, 713, 714, 716 and 717 are of width out_x (711) and height out_y (715).

In order to generate one pixel 712 in one of the output FMs such as 713, two dimensional kernels of each input FM 702 (such as kernels 707, 706 and 718 of FM's 701, 702 and 703 respectively) are convolved (using convolution operators with corresponding kernel weights) to form respective intermediate pixel output data (such as 709, 708 and 719). The intermediate pixel output data (such as 709, 708 and 719) are summed by an adder 710 to create an output pixel in the output feature map (such as pixel output 712 of output FM 714).

In the present example, the kernels 706, 707, . . . 718 are of equal size k_size (721)×k_size (720). The intermediate pixel output data 709, 708 and 719 of the convolutions are summed by the adder 710. For most CNN processes, the number of input FMs and output FMs is typically measured in the hundreds, making layer operations very computationally intensive. Similarly, there is a significant amount of data movement involved during layer computations, making on/off-chip data management (i.e. local and external memory) an equally complex process.

Table 1 lists parameters required to define the processing of each convolution layer. Note that these parameters can vary significantly across different layers of a given CNN application.

Pooling Layer:

A pooling stage (with multiple pooling layers) may be inserted after the convolution layer 700 to reduce the spatial size of output FMs (such as 714) from the convolution stage operation. Reducing the spatial size of output FMs helps in reducing the number of parameters of and operations that need to be performed by a subsequent layer. One of the most common types of pooling layer is referred to as "maxpool". In the maxpool operation, a maximum valued pixel is chosen from a rectangular window of neighbouring pixels in an output FM of the convolution layer. A pooling layer is used to further downsample an output FM. The aforementioned down sampled (also known as pooled) output FM being referred to is an input FM for the subsequent layer. Therefore, the pooling layer only reduces the width and the height of the output FM.

Classification Layer:

A classification stage (consisting of multiple classification layers) is added at the end of the convolution and pooling layers to perform object identification. The output of the classification layer can be visualised as a one-dimensional array. To determine the elements of the output array, all input pixels are convolved with predefined weights to get a single pixel result. Each element in the output array actually identifies if the input image (given at the start of CNN processing) belongs to a certain category.

TABLE 1

CNN Layer Parameters

| Abbreviation | Parameter Description |
| --- | --- |
| if $m_l$ | total number of input FMs in layer l |
| in_$x_l$ | x-dimension size (number of columns) of each input FM in layer l |
| in_$y_l$ | layer l y-dimension size (number of rows) of each input FM |
| $inb_l$ | input feature map element (such as pixel) size in bytes for each layer l |
| ifm_$size_l$ | Layer l input feature map size (= in_$x_l$ × in_$y_l$ × $inb_l$) |
| k_$w_l$ | Layer l Kernel width in number of columns |
| k_$h_l$ | Layer l Kernel height in number of rows |
| kb | Each kernel weight size in bytes |
| k_size | kernel weight matrix size (= k_w × k_h × kb) |
| s | stride size in number of rows/columns (the term "stride" is a parameter of the convolution, and relates to how far the convolution filter kernel moves during each step. It is used in the do_conv_and_sum( ) function call in FIG. 8) The convolution and summing operations are performed in feature maps per stride. |
| $ofm_l$ | total number of output FMs in layer l |
| out_$x_l$ | x-dimension size (number of columns) of each output FM in layer l |
| out_$y_l$ | y-dimension size (number of rows) of each output FM in layer l |
| $ob_l$ | layer l output feature map element (such as pixel) size in bytes for each layer l |
| ofm_$size_l$ | layer l output feature map size (= out_$x_l$ × out_$y_l$ × $ob_l$) |

CNN Hardware Accelerator

This disclosure is concerned with external memory access cost of CNN hardware accelerator System-on-Chip (SoC) designs where general purpose (GP) computing cores are augmented with a CNN hardware accelerator.

Figure 16:
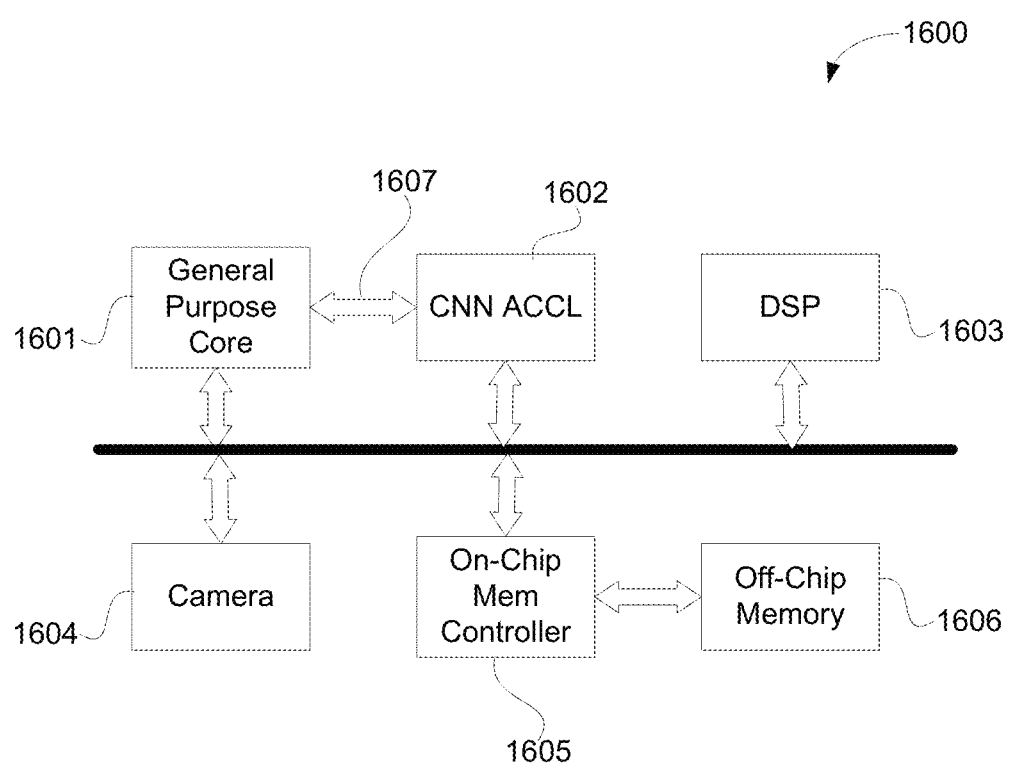
FIG. 16 is an example of a general purpose SoC design with a CNN hardware accelerator.

FIG. 16 depicts an example SoC design 1600. A General Purpose (GP) core 1601 programs a CNN accelerator 1602 through a special programming interface 1607. A software routine (not shown) on the GP core 1601 places input images (not shown) and convolution weight kernels (not shown) in an off-chip external memory 1606 and instructs the CNN accelerator SoC 1602 to process these images through a supplied CNN application architecture (i.e. CNN process such as 1303). The CNN accelerator SoC 1602 then processes the input images and stores the result in the off-chip memory 1606. Note that the CNN accelerator SoC 1602 shares bandwidth of the off-chip memory 1606 with GP cores such as 1601 and other on-chip components such as a DSP block 1603, a camera 1604 and other application accelerators (not shown). The RAMABS arrangements in this disclosure optimise the number of external memory accesses for the CNN accelerator SoC 1602.

Figure 6:
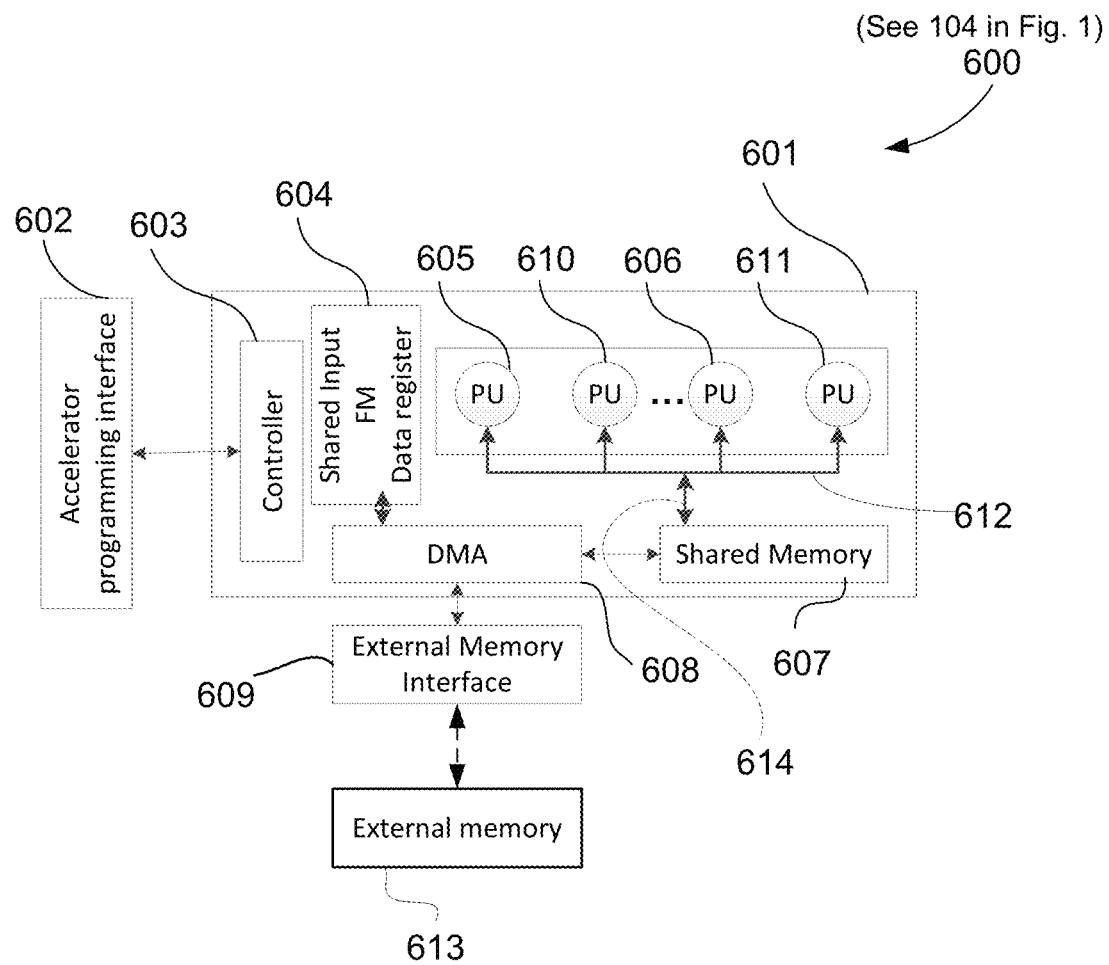
FIG. 6 is an example block diagram of a multi-accelerator SoC architecture.

FIG. 6 is an example block diagram 600 of a multi-accelerator SoC 601 (also see 1314). A CNN process such as 1303 is executed by the multi-accelerator based SoC 601 by inputting the appropriate scheduling schemes such as 1308 to the SoC 601 via the interface 602. The multi-accelerator SoC 601 has multiple accelerators or processing units (PUs) 605, 610, . . . 606, and 611. The PUs, 605, 610, . . . 606, 611, can either communicate directly with each other (as depicted by a communication path 612) or via a shared memory 607. Controller 603: The controller 603 is responsible for managing the computation and communication activities within the multi-accelerator SoC 601. The controller 603 is programmed, using a general purpose computer 1200 (see FIGS. 12A and 12B) via the interface 602 (which is also referred to as the accelerator programming interface 602) and the I/O interface 1208 for example, thereby providing scheduling scheme instructions for the PUs in the SoC 601. The controller 603 has a direct link (not shown) with each PU in order to issue instructions to the PU in question. Once the PU in question finishes executing the instruction, the PU notifies the Controller 603, for example by using an interrupt.

In addition to issuing computation instructions to the PUs, the controller 603 manages data transfers between the on-chip shared memory 607 (same as 1310 in FIG. 13) and the external memory 613 (same as 1309 in FIG. 13) by programming the Direct Memory Access (DMA) module 608. The external memory 613 is accessed via an external memory interface 609. A prime reason for including the external memory 613 is that in a cost-constrained system, there typically will be inadequate on-chip memory to store all the FMs for a particular CNN layer, and hence some of the FMs will need to be stored in external memory 613 during processing, with the DMA 608 used to load/store the FMs to/from on-chip memory when required.

The controller 603 can be programmed to execute different scheduling schemes. Accessing the external memory 613 repeatedly can cause significant latency and power penalty. To alleviate this problem, the accelerator SoC 601 in the RAMABS arrangement 600 is provided with the on-chip shared memory 607 in order to minimise accesses to the external memory 613. The SM 607 may be configured in different ways. In one RAMABS arrangement, local memory modules such as 1315 and 1320 are associated with each PU having a shared on-chip shared memory 1310. In another RAMABS arrangement, no distributed or individual local memory modules such as 1320 per PU are provided, and all PUs access a common on-chip shared memory such as 607 (also see 1310 in FIG. 13).

Shared Memory 607:

Accessing the external memory 613 (e.g. DDR memory) repeatedly can give rise to significant latency and power penalty. To alleviate this problem, the accelerator SoC is augmented with an SRAM based (i.e. on-chip) Shared Memory (SM) 607 to minimise external memory accesses. At the request of the Controller module 603, the DMA module 608 can transfer data between SM 607 and the external memory 613. PUs such as 605 can directly access the contents of the SM 607 as depicted by a communication path 614. The size of the SM 607 can be changed at design time depending on various factors such as area or performance constraints.

Direct Memory Access (DMA) Module 608:

The DMA module 608 enables efficient data movement between the SM 607 and the external memory 613. The Controller 603 can issue a series of DMA requests depending upon how the CNN application 1303 is mapped to the HW accelerator SoC 1314. In a preferred RAMABS implementation, at the request of the controller module 603 the DMA module 608 transfers data between the SM 607 and the external memory 613. The PUs 605, 610, . . . 606, 611 can directly access the contents of the SM 607. The size of the SM 607 is constrained depending upon various factors such as area, performance and power. The DMA module 608 enables efficient data transfer between the SM 607 and the external memory 613.

The controller 603 issues a series of DMA requests depending upon how the scheduling schemes (eg 1308) associated with the CNN process (eg 1303) are mapped onto the SoC 601. The Shared Input FM Data Register 604 is utilised in order to broadcast data signals to all the PUs 605, 610, . . . 606, 611. In a preferred RAMABS implementation, each PU such as 605, 610, . . . 606, 611 in the SoC 601 is able to perform all the required operations, such as convolution, transfer function and pooling. However, the depicted architecture can also contain function specific and heterogeneous PUs (i.e., PUs supporting only convolution and pooling separately), restricting the possible scheduling schemes that can be applied. In a preferred RAMABS implementation, each PU consists of a series of multipliers 1908, . . . , 1910 and adders 1911 necessary to implement the basic convolution operation. Having multiple multipliers enables processing multiple pixels from an input FM and a kernel weight matrix in parallel. The network of multipliers and adders can be configured to perform accumulation operations when needed. A special "pool" unit may be included to perform pooling operation when the PUs are designed only to perform convolution operation. Shared Input FM Data Register 604: Input FM data is stored in this register 604 and is broadcast to all PUs such as 605 in the system 600. This feature is useful for implementing certain scheduling techniques that are described later.

Processing Unit (PU) 605:

Processing Units are the computational workhorses of this accelerator SoC architecture. Each PU such as 605 is able to perform vector multiplication and additions required for convolution and the pooling operations described earlier.

In one RAMABS arrangement, the PUs expect input data to be stored in the SM 607. In case of limited SM 607, a scheduling scheme should be applied to bring input FMs or kernel weights from the external memory 613 to the shared memory 607 before processing.

Figure 19:
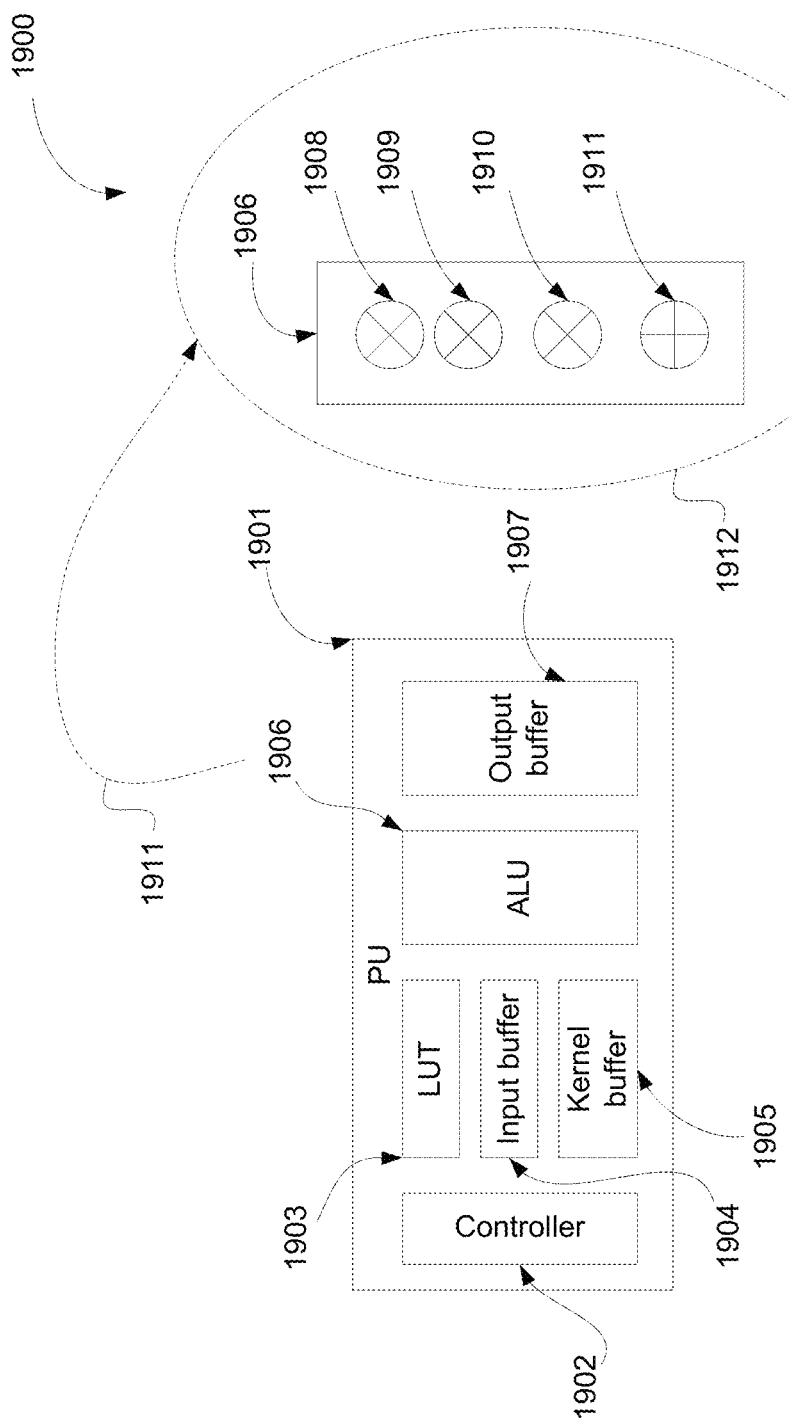
FIG. 19 shows an example PU.

FIG. 19 shows an example PU implementation. Each PU 1901 may have a controller 1902 to manage operations among different functional units within the PU such as 1903 . . . 1911, as well as external interfaces e.g. shared memory 607, system controller 603. These interfaces may vary depending upon hardware accelerator design and implementation. Each PU may contain a number of internal buffers 1903, 1904, 1905, 1907 for storing look-up table (LUT) data 1903, input feature map kernel data 1904, kernel weights 1905 and temporary output data 1907. The ALU 1906 may, as depicted by a dashed arrow 1911 and an insert shown as a dashed ellipse 1912, consist of a number arithmetic operational units e.g. multipliers 1908 . . . 1910, adder 1911 etc. Each PU may also contain other special functional units, e.g. pooling unit (not shown), to further accelerate hardware processing of data. CNN convolution, transfer function, pooling or similar operations can be performed by each PU 1901. Operation of the multi-accelerator SoC 601 is described in more detail with reference to FIG. 6.

Layered Processing

As described earlier, a typical CNN application such as 1303 contains a series of convolution and pooling layers. Each convolution layer of the CNN has a unique set of parameters, some example parameters are listed in Table 1. In traditional arrangements which use a fixed scheduling scheme across all layers, due to varying parameters each layer can have varying performance and memory access patterns for a given hardware platform. The present RAMABS disclosure departs from the traditional practice of designing hardware for a given fixed scheduling scheme. Instead, the disclosed RAMABS arrangements utilise a flexible architecture and select an optimal or near optimal scheduling scheme for each layer from a given set of scheduling schemes.

Figure 17:
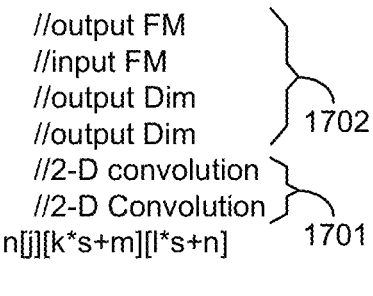
FIG. 17 is an example of convolution layer processing through nested loops.

FIG. 17 shows an example 1700 of a CNN implementation (see 1301 in FIG. 13) having, in the present example, a nested loop structure for convolution layer processing. Two inner loops 1701 implement a 2-D convolution. The target accelerator (ie one or more PUs) treats the 2-D convolution operations as one atomic operation. However, the programmer has the flexibility to schedule four outer loops 1702 in different combinations, resulting in different scheduling schemes. Each scheduling scheme will have an impact on execution time, memory accesses and the on-chip memory size requirement. The disclosed RAMABS arrangements aim to select one of the scheduling schemes from a pre-defined set of scheduling schemes 1308 for each layer based on the layer parameters set out in Table 1.

An Example CNN Implementation

Figure 8:
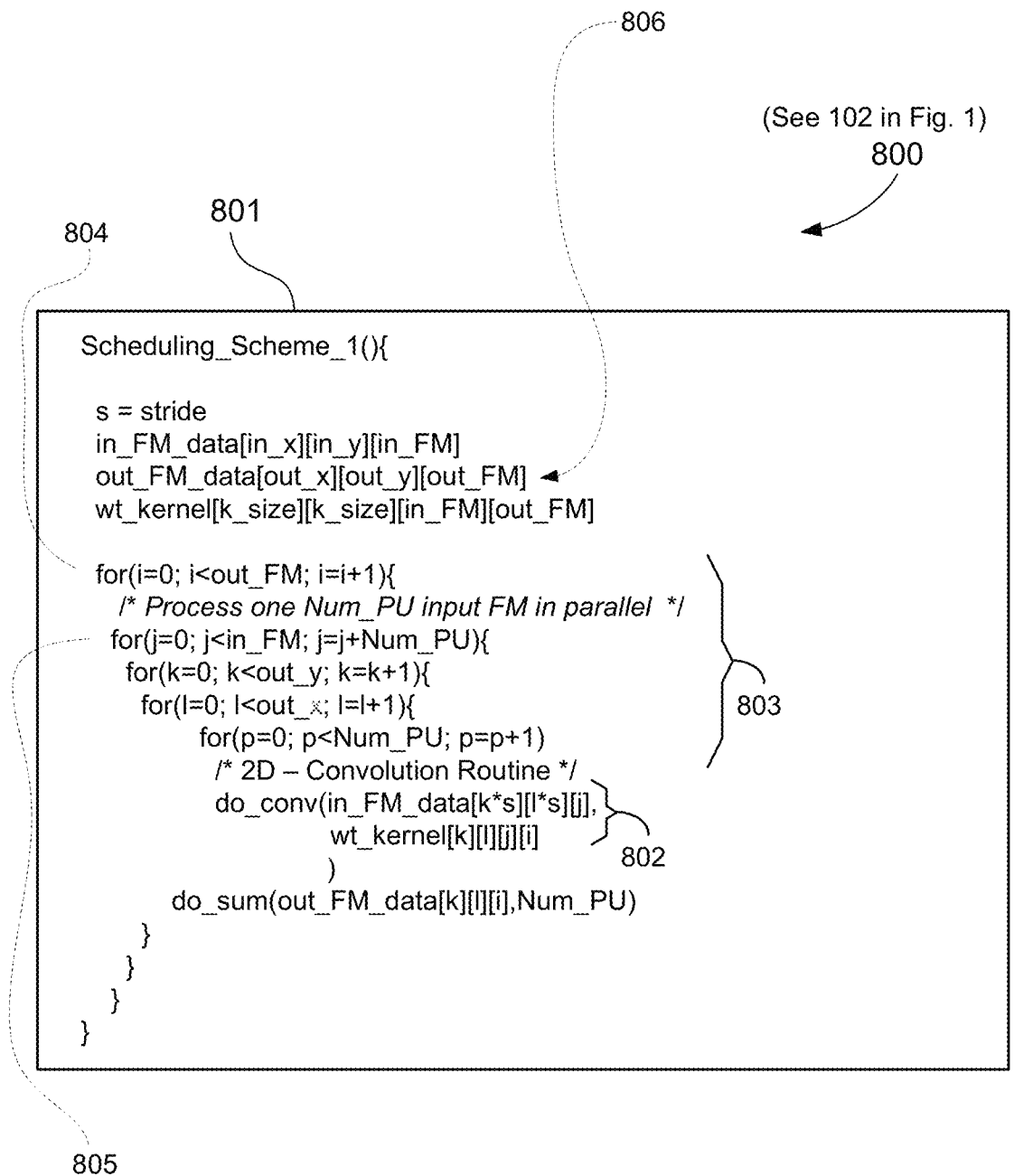
FIG. 8 is an example of a scheduling scheme exploiting parallelism by processing multiple input feature maps in parallel.

FIG. 8 shows an example of software 800 for implementing a CNN process, and the software 800 typically consists of deeply nested code loops. Two inner loops 802 implement a 2-D convolution. The example accelerator (ie one or more PU) treats the 2-D convolution operations as one atomic operation. However, the programmer has the flexibility to schedule the outer loops 803 in different combinations, resulting in different scheduling schemes. Each scheduling scheme will have an impact on execution time, memory accesses and local memory size requirement. Therefore the goal is to choose one of the scheduling schemes from a predefined set of scheduling schemes for each layer based on the layer parameters. As described hereinafter in more detail in regard to FIG. 4, the layer parameters combine to produce parameters A and B (see equation [22])

Figure 13:
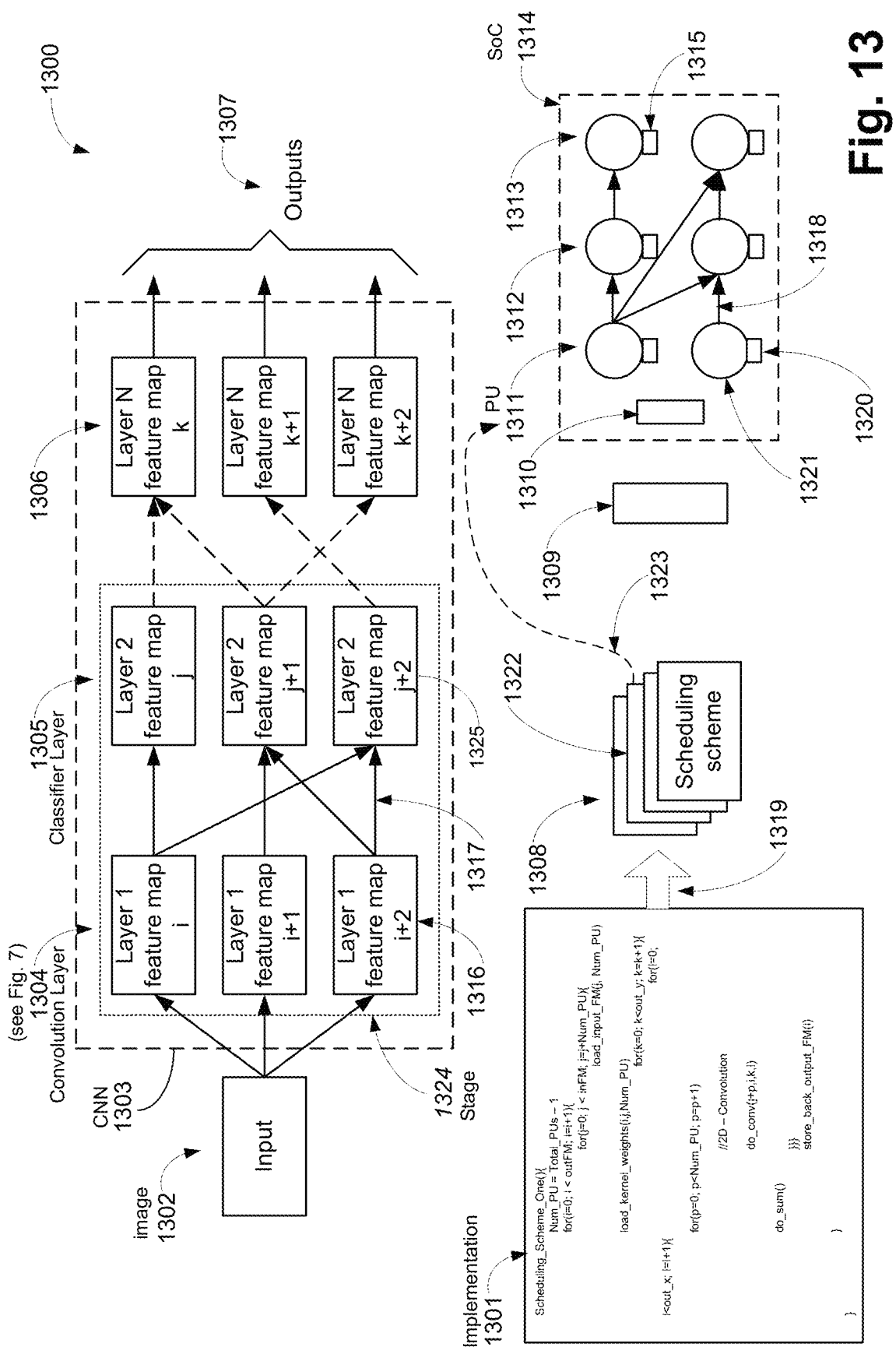
FIG. 13 is a schematic block diagram illustrating how a CNN process can be implemented.

When implementing the RAMABS arrangements using the architecture depicted in FIG. 13, it is noted that the sizes of the on-chip memory modules 1320, 1315, 1310 are typically fixed when the SoC 1314 is fabricated. The amount of memory required by each layer to execute the CNN process 1303 is however defined by the scheduling schemes 1308. The memory management used by the RAMABS arrangements in order to accommodate the memory requirements specified by the scheduling schemes using the memory modules 1320, 1315, 1310 in the SoC and the external memory 1309 is described hereinafter in more detail with reference to FIGS. 10, 11, 14 and 15.

An Example Architecture Implementation

Each PU such as 605, 1311 typically has a series of multipliers 1908, . . . , 1910 and adders 1911 which are used to implement the basic convolution operation. Having multiple multiplier units in each PU enables the PU to process multiple pixels such as 712 from an input FM such as 702 and a kernel weight matrix (not shown) in parallel. There are typically three small buffers in each PU, namely Input Buffer 1904, Weight Buffer also known as Kernel Buffer 1905 and Output Buffer 1907 where an input buffer 1904 stores input FMs during calculations, a weight buffer also known as kernel buffer 1905 stores the values of CNN kernel weights used in the CNN convolutions and an output buffer 1907 stores output FMs during calculations. The contents of the Input Buffer and the Weight Buffers (Kernel buffers) are typically fetched from the accelerator's shared memory 607. The network of multipliers and adders can be configured to perform accumulation operation on incoming data. A special POOL unit can be included to perform pooling layer operation.

Two of the possible scheduling methods are disclosed in RAMABS arrangements are now described. It is noted that the PUs expect input data to be stored in on-chip shared memory such as 607. In case of limited on-chip memory, not all data can be placed on-chip. Therefore, the scheduling scheme may need to bring input FMs from external memory such as 613 into the on-chip SM 607 before processing. The kernel weights may be stored in the external memory 613. Since kernel weight sizes are relatively small compared with feature map size, it is preferred to store them in on-chip memory.

FIG. 8 shows a fragment 800 of pseudo-code depicting an example implementation (such as 1301) used by a scheduling scheme in order to execute a convolution layer such as 1304. The convolution layer processes ifm$_l$ input FMs to produce ofm$_l$ output FMs. Scheduling_Scheme 1( ) (ie 801) generates one output FM at a time. The depicted scheduling scheme 801 exploits parallelism by processing multiple input FMs in multiple PUs, where the parameter Num_PU is referred to as the number of processing elements available in the multi-accelerator SoC 601. In 801, the parameters do_conv( ) and do_sum( ) abstract the capabilities of PUs to perform 2D convolution and summing operation on data. In some disclosed RAMABS arrangements, depending on SoC architecture, the do_sum( ) operation can be assigned to a dedicated PU.

The parameter s=stride is a parameter associated with the convolution operation. It relates to how far the convolution filter kernel moves in each step. This parameters is used in the do_conv_and_sum( ) function call in FIG. 8.

In the example scheduling scheme 801, each output FM 806 is processed in the outermost for-loop 804, and therefore the partial output FM is not required to be loaded again (this being reflected in the reusability equations 204). However, the loop for in_FM (ie 805) is executed for each output FM and the same input data is brought in repeatedly (this being reflected in the reusability equations 11-13, step 204). Therefore, this example scheduling scheme 801 has higher data reuse for input FM data and higher reuse for intermediate output FM data. Intermediate output FM data are preferably stored in on-chip memory, if memory size permits, and reused. This example assumes that the on-chip memory is big enough to store at least one full output FM. Partial intermediate output FM needs storing in the external memory if there is not enough room for one output FM storage.

Figure 9:
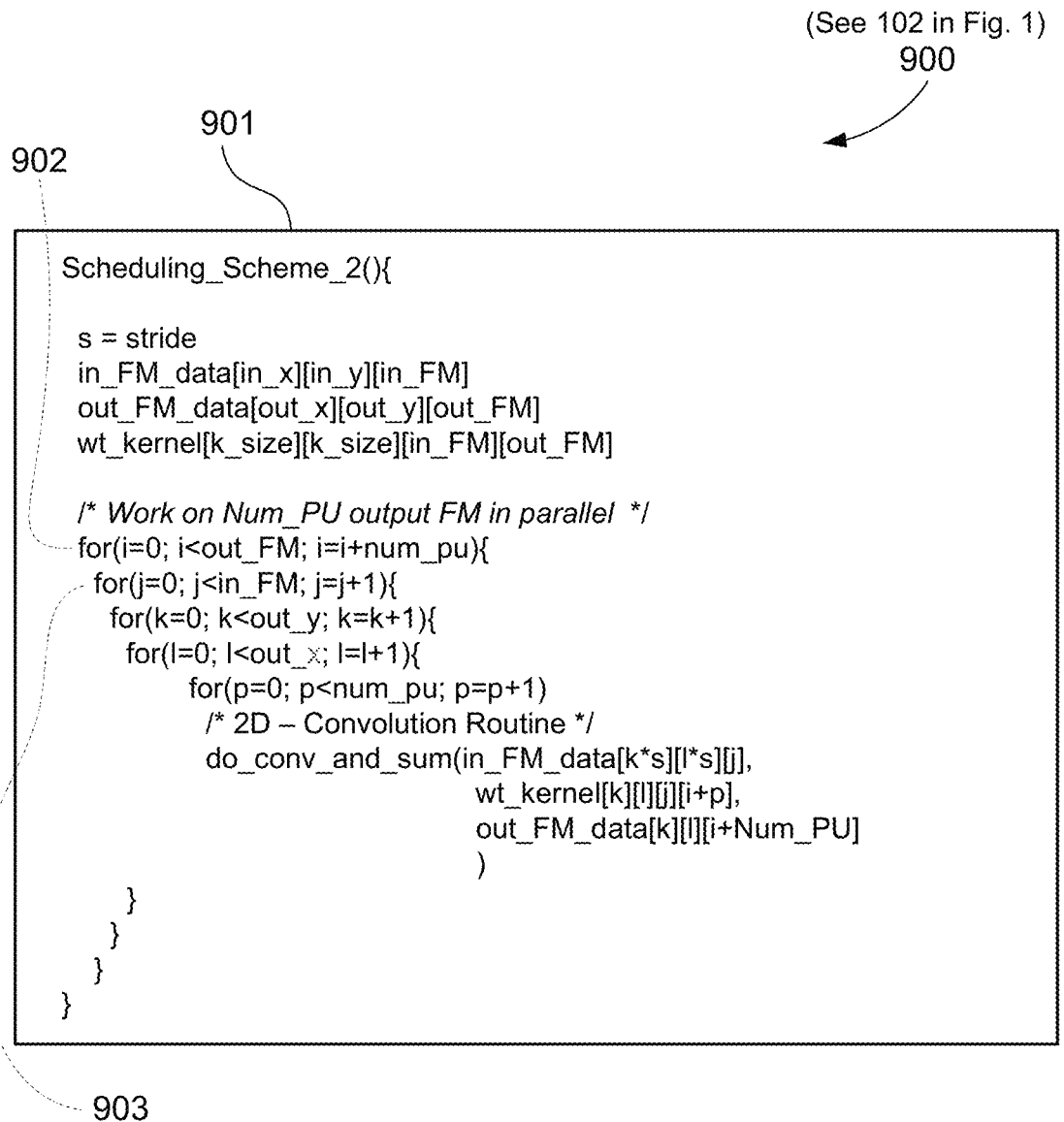
FIG. 9 is an example of a scheduling scheme exploiting parallelism by generating multiple output feature maps in parallel.

FIG. 9 shows a fragment 900 of pseudo-code depicting an example implementation (such as 1301) used by another scheduling scheme. The Scheduling_Scheme_2( ) (ie 901) processes one input FM at a time and generates multiple output FMs. The scheduling scheme 901 exploits parallelism by processing Num_PU output FMs in parallel. The parameter do_conv_and_sum( ) abstracts the capabilities of PUs to perform a 2D convolution and add the results to existing partial results in one go.

In the example scheduling scheme 901, the Num_PU output FMs are generated in the outermost for-loop 902, and therefore, the partial output FM is not required to be loaded again. However, the loop for in_FM ie 903 is executed for each output FM and the same input data is brought in repeatedly. Therefore, input FMs are loaded out_FM/Num_PU times.

There are three important points that are noted from the code in schemes 801 and 901. Firstly, although the programming loop orders (ie the order in which the loops are executed) are the same for both schemes, the schemes 801, 901 exploit the parallelism in different ways. The scheme 801 processes input FMs in parallel, whereas the scheme 901 processes output FMs in parallel. This distinction can lead to different memory access behaviour for the two schemes 801, 901. Secondly, each PU in scheme 801 performs convolution operation (operation do_conv( )) on input FM data producing temporary output FM data and summing of temporary output data is done in a later stage (operation do_sum( )), whereas each PU in scheme 901 produces one output FM data by performing convolution on the input FM data producing intermediate output FM and summing the result with the previous intermediate output FM data (operation do_conv_and_sum( )). These abstract operations represent low-level operations performed by the SoC and PUs, and can have potentially different execution time. Both the scheme 801 and the scheme 901 only define the computational order of schemes, assuming that the data required (input FM, output FM and weight kernels) are already loaded in the memory hierarchy as required.

Figure 10:
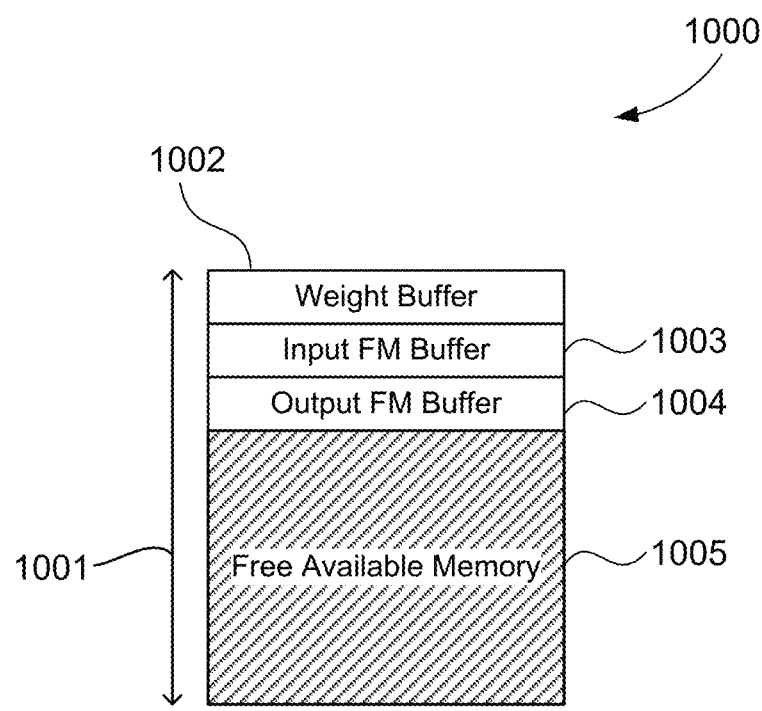
FIG. 10 shows an example memory layout after allocating the minimum space required to start a the scheduling scheme.

FIG. 10 shows an example memory layout 1000 after allocating the minimum space required to start executing a scheduling scheme. The on-chip memory 1000 assigned to a set of PUs on the SoC has a fixed memory size 1001 determined by the configuration of the target accelerator hardware 110. The local memory 1000 can be configured as PU specific memory in the same manner as 1315, 1320 in FIG. 13, or it can be configured as one shared memory such as 607 or 1310 which is shared between all the PUs. The on-chip memory 1000 is used to store data during processing of a scheduling scheme associated with a CNN layer. Three buffers within the memory 1000 are allocated for this processing, namely (i) a weight buffer 1002 for storing the values of CNN kernel weights used in the CNN convolutions; (ii) an input FM buffer 1003 to store input FMs during calculations; and (iii) an output FM buffer 1004 to store output FMs during calculations. The sizes of these three buffers are determined by the CNN process (eg 1303) and the specific scheduling scheme (eg 1322) for the layer in question (eg 1304). Together, the three buffer sizes constitute the minimum buffer requirement in the on-chip memory 1000 for the scheduling scheme in question.

The remaining free memory 1005 is available for storing input FMs and output FMs as required by the scheduling scheme.

Figure 11:
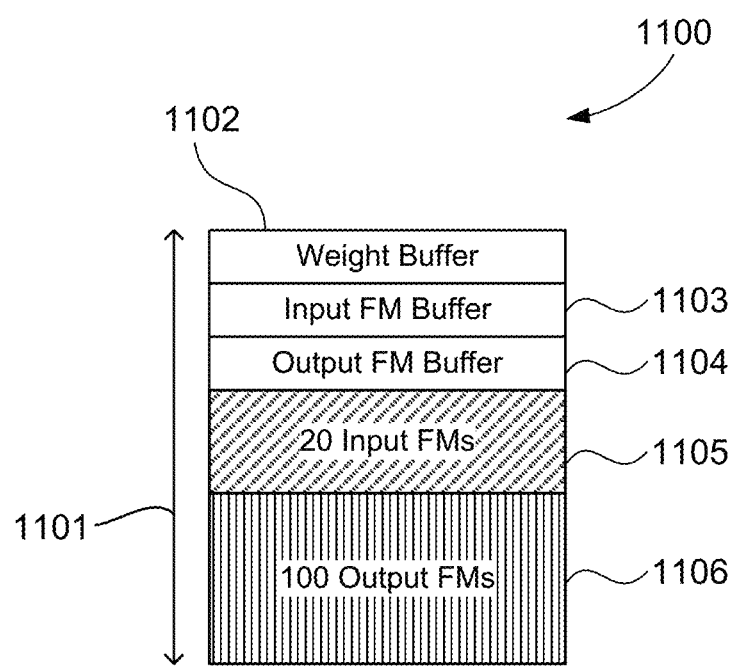
FIG. 11 shows an example memory layout after free memory from FIG. 10 is allocated to input and output feature maps for a particular CNN layer.

FIG. 11 shows an example memory layout after the free memory 1005 from FIG. 10 is allocated to input and output feature maps for a particular CNN layer. The representation depicted in FIG. 11 is referred to as a memory map, and depicts the amount of memory in the memory 1101 which is allocated to the various buffers and feature maps. The on-chip memory 1100 assigned to the set of PUs on the SoC has a fixed memory size 1101, and memory is allocated for the weight buffer 1102, the input FM buffer 1103 and the output FM buffer 1104. The remaining memory is allocated in this instance to hold twenty input FMs (in a memory partition 1105) and one hundred output FMs (in a memory partition 1106).

One formal problem definition that can be used in regard to the RAMABS arrangements is as follows:

Given:

1) $S$, a set of scheduling schemes (such as 1308)

where $S=\{S_1, S_2, \ldots, S_N\}$, where $N$ is total number of scheduling schemes [1]

2) $L$, a set of layers (such as 1304,1305, . . . ) in a target CNN process (such as 1303).

where $L=\{L_1, L_2, \ldots, L_M\}$, where $M$ is total number of layers [2]

3) $MemA$, a set of possible memory allocations for given pair, the pair comprising a scheduling scheme and a layer.

$MemA=\{MemA^{ls}_1, MemA^{ls}_2, \ldots\}$ where $l \in L$ and $s \in S$ [3]

4) The target hardware accelerator SoC (such as 1314) with a fixed set of PUs (such as 1311, 1321, . . . ) [4]

5) Architecture memory size constraint, $Mc$ [5]

Where: Mc specifies a maximum on-chip memory size for the SoC which includes on-chip shared memory 607, 1310, and the PU specific on-chip local memories 1320, 1315

Find:

1—$LS'$, a set of scheduling scheme for each layer [6]

where $LS'=\{LS_1', LS_2', \ldots, LS_{M'}'\}$, where $M$ is total number of layers, and $LS_1' \in S$ [7]

2—$MemA'$, local memory allocations for each layer [8]

where $MemA'=\{MemA_1', MemA_2', \ldots, MemA_M'\}$, where $M$ is total number of layers [9]

Such that:

the number of external memory accesses required to execute the complete CNN process is reduced or minimised.

There are two reasons to minimise external memory accesses. Firstly, due to a limited external memory bandwidth, it is desirable to minimise the impact on memory access bandwidth arising from external memory accesses which are initiated by PUs such as 605 since such accesses will adversely impact the memory latency for memory accesses initiated by other system-on-chip (SoC) components such as the general purpose processor 1205. Secondly, the external memory accesses (ie accesses to the external memory 613) typically have much higher latencies in the range of hundreds of clock cycles whereas local on-chip memory accesses are typically limited to several clock cycles (1-4 cycles for example). Although having an on-chip memory can help in reducing off-chip memory accesses, the size of on-chip memory must also adhere to area constraints imposed by the SoC. On the other hand, the CNN process 1303 is often executed with a real-time execution constraint such as frames per second. From the formal definition of the problem set out at [1]-[5], a scheduling scheme can be identified from a set S of scheduling schemes for each layer in the set L. Furthermore, when a scheduling scheme is used with a CNN layer, the on-chip memory can be allocated in Q different ways. Therefore, the size of the design space is proportional to $(Q*N)^M$, where M and N are the sizes of sets L and S, respectively, and Q is the number of possible memory allocations schemes.

Figure 12A:
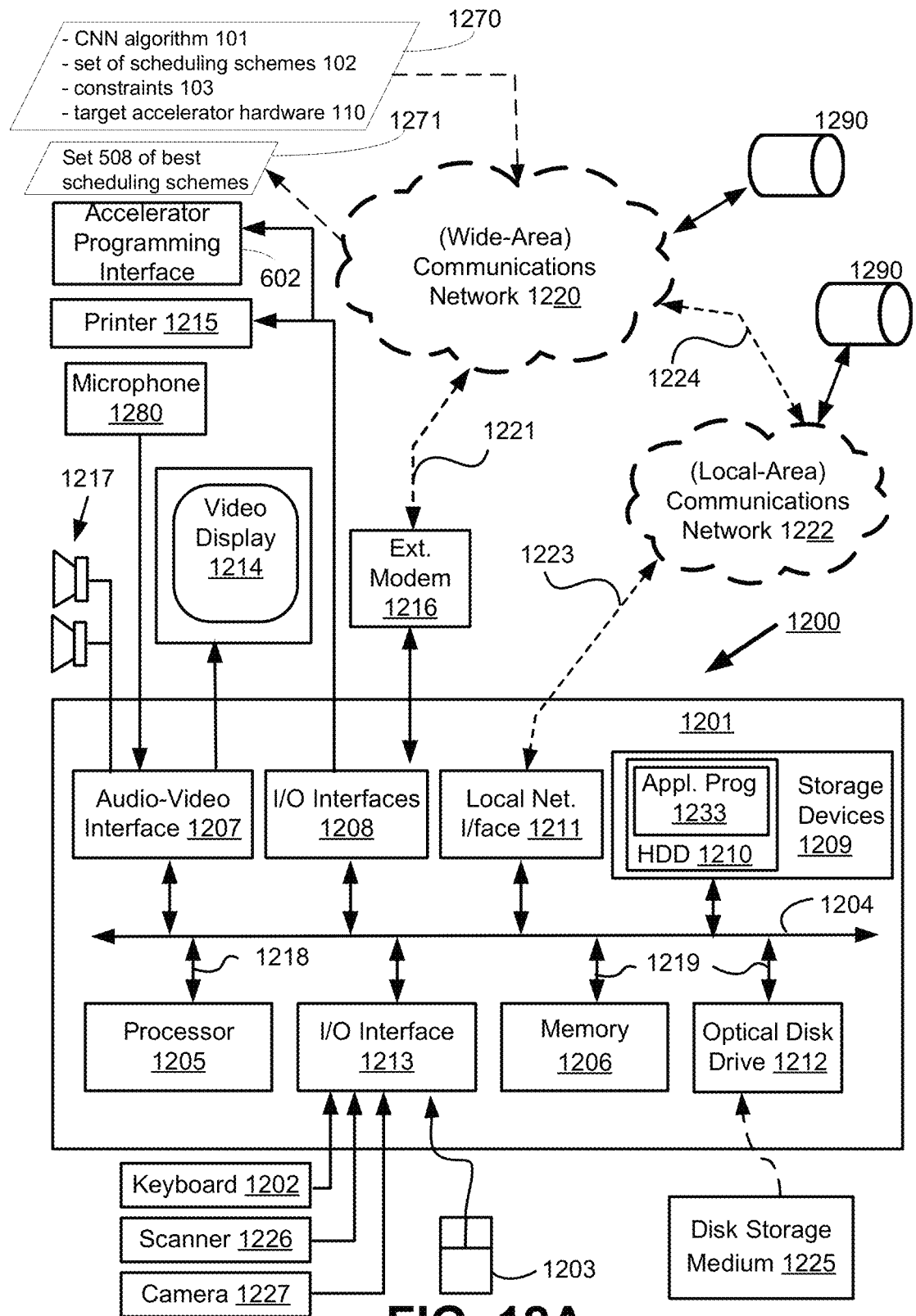
FIGS. 12A and 12B depict a general-purpose computer system 1200, upon which the various RAMABS arrangements described can be practised.
Figure 12B:
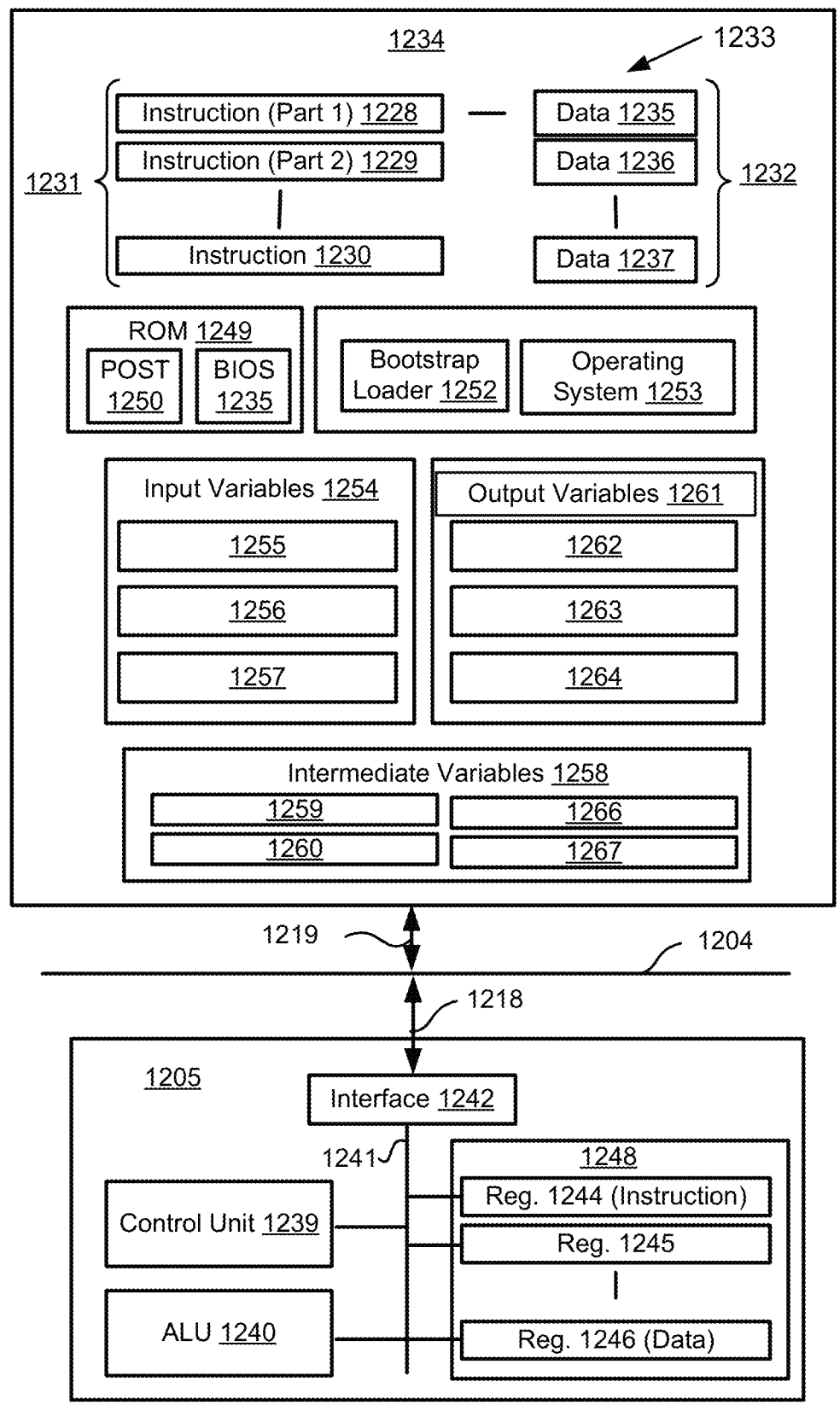

FIGS. 12A and 12B depict a general-purpose computer system 1200, upon which the various RAMABS arrangements described can be practised. More particularly, the computer system executes a RAMABS software application 1233 in order to implement a process 100, described hereinafter in more detail with reference to FIG. 1. The aforementioned process 100 determines, from a set of input data 1270, an optimal or nearly optimal set 1271 of scheduling schemes for executing the CNN process 101 in question on the specified SoC. The process 100 thus configures the SoC 601 by determining the best set 1271 of scheduling schemes for executing the CNN process 101 (where the term "best" means optimal or close to optimal). The controller 603 cam also be programmed, using the general purpose computer 1200 (see FIGS. 12A and 12B) via the interface 602 (which is also referred to as the accelerator programming interface 602) and the I/O interface 1208 for example, thereby providing scheduling scheme instructions for the PUs in the SoC 601.

As seen in FIG. 12A, the computer system 1200 includes: a computer module 1201; input devices such as a keyboard 1202, a mouse pointer device 1203, a scanner 1226, a camera 1227, and a microphone 1280; and output devices including a printer 1215, a display device 1214 and loudspeakers 1217. An external Modulator-Demodulator (Modem) transceiver device 1216 may be used by the computer module 1201 for communicating to and from a communications network 1220 via a connection 1221. The communications network 1220 may be a wide-area network (WAN), such as the Internet, a cellular telecommunications network, or a private WAN. Where the connection 1221 is a telephone line, the modem 1216 may be a traditional "dial-up" modem. Alternatively, where the connection 1221 is a high capacity (e.g., cable) connection, the modem 1216 may be a broadband modem. A wireless modem may also be used for wireless connection to the communications network 1220.

The computer module 1201 typically includes at least one processor unit 1205, and a memory unit 1206. For example, the memory unit 1206 may have semiconductor random access memory (RAM) and semiconductor read only memory (ROM). The computer module 1201 also includes an number of input/output (I/O) interfaces including: an audio-video interface 1207 that couples to the video display 1214, loudspeakers 1217 and microphone 1280; an I/O interface 1213 that couples to the keyboard 1202, mouse 1203, scanner 1226, camera 1227 and optionally a joystick or other human interface device (not illustrated); and an interface 1208 for the external modem 1216 and printer 1215 as well as for the accelerator programming interface 602. In some implementations, the modem 1216 may be incorporated within the computer module 1201, for example within the interface 1208. The computer module 1201 also has a local network interface 1211, which permits coupling of the computer system 1200 via a connection 1223 to a local-area communications network 1222, known as a Local Area Network (LAN). As illustrated in FIG. 12A, the local communications network 1222 may also couple to the wide network 1220 via a connection 1224, which would typically include a so-called "firewall" device or device of similar functionality. The local network interface 1211 may comprise an Ethernet circuit card, a Bluetooth® wireless arrangement or an IEEE 802.11 wireless arrangement; however, numerous other types of interfaces may be practised for the interface 1211.

The I/O interfaces 1208 and 1213 may afford either or both of serial and parallel connectivity, the former typically being implemented according to the Universal Serial Bus (USB) standards and having corresponding USB connectors (not illustrated). Storage devices 1209 are provided and typically include a hard disk drive (HDD) 1210. Other storage devices such as a floppy disk drive and a magnetic tape drive (not illustrated) may also be used. An optical disk drive 1212 is typically provided to act as a non-volatile source of data. Portable memory devices, such optical disks (e.g., CD-ROM, DVD, BluRay Disc™), USB-RAM, portable, external hard drives, and floppy disks, for example, may be used as appropriate sources of data to the system 1200.

The components 1205 to 1213 of the computer module 1201 typically communicate via an interconnected bus 1204 and in a manner that results in a conventional mode of operation of the computer system 1200 known to those in the relevant art. For example, the processor 1205 is coupled to the system bus 1204 using a connection 1218. Likewise, the memory 1206 and optical disk drive 1212 are coupled to the system bus 1204 by connections 1219. Examples of computers on which the described arrangements can be practised include IBM-PC's and compatibles, Sun Sparcstations, Apple Mac or like computer systems.

The RAMABS method may be implemented using the computer system 1200 wherein the processes of FIGS. 1-5, 8, 9, 13 and 17, to be described, may be implemented as one or more software application programs 1233 executable within the computer system 1200. In particular, the steps of the RAMABS method are effected by instructions 1231 (see FIG. 12B) in the software 1233 that are carried out within the computer system 1200. The software instructions 1231 may be formed as one or more code modules, each for performing one or more particular tasks. The software may also be divided into two separate parts, in which a first part and the corresponding code modules performs the RAMABS methods and a second part and the corresponding code modules manage a user interface between the first part and the user.

The software may be stored in a computer readable medium, including the storage devices described below, for example. The software is loaded into the computer system 1200 from the computer readable medium, and then executed by the computer system 1200. A computer readable medium having such software or computer program recorded on the computer readable medium is a computer program product. The use of the computer program product in the computer system 1200 preferably effects an advantageous RAMABS apparatus.

The software 1233 is typically stored in the HDD 1210 or the memory 1206. The software is loaded into the computer system 1200 from a computer readable medium, and executed by the computer system 1200. Thus, for example, the software 1233 may be stored on an optically readable disk storage medium (e.g., CD-ROM) 1225 that is read by the optical disk drive 1212. A computer readable medium having such software or computer program recorded on it is a computer program product. The use of the computer program product in the computer system 1200 preferably effects a RAMABS apparatus.

In some instances, the application programs 1233 may be supplied to the user encoded on one or more CD-ROMs 1225 and read via the corresponding drive 1212, or alternatively may be read by the user from the networks 1220 or 1222. Still further, the software can also be loaded into the computer system 1200 from other computer readable media. Computer readable storage media refers to any non-transitory tangible storage medium that provides recorded instructions and/or data to the computer system 1200 for execution and/or processing. Examples of such storage media include floppy disks, magnetic tape, CD-ROM, DVD, Blu-ray™ Disc, a hard disk drive, a ROM or integrated circuit, USB memory, a magneto-optical disk, or a computer readable card such as a PCMCIA card and the like, whether or not such devices are internal or external of the computer module 1201. Examples of transitory or non-tangible computer readable transmission media that may also participate in the provision of software, application programs, instructions and/or data to the computer module 1201 include radio or infra-red transmission channels as well as a network connection to another computer or networked device, and the Internet or Intranets including e-mail transmissions and information recorded on Websites and the like.

The second part of the application programs 1233 and the corresponding code modules mentioned above may be executed to implement one or more graphical user interfaces (GUIs) to be rendered or otherwise represented upon the display 1214. Through manipulation of typically the keyboard 1202 and the mouse 1203, a user of the computer system 1200 and the application may manipulate the interface in a functionally adaptable manner to provide controlling commands and/or input to the applications associated with the GUI(s). Other forms of functionally adaptable user interfaces may also be implemented, such as an audio interface utilizing speech prompts output via the loudspeakers 1217 and user voice commands input via the microphone 1280.

FIG. 12B is a detailed schematic block diagram of the processor 1205 and a "memory" 1234. The memory 1234 represents a logical aggregation of all the memory modules (including the HDD 1209 and semiconductor memory 1206) that can be accessed by the computer module 1201 in FIG. 12A.

When the computer module 1201 is initially powered up, a power-on self-test (POST) program 1250 executes. The POST program 1250 is typically stored in a ROM 1249 of the semiconductor memory 1206 of FIG. 12A. A hardware device such as the ROM 1249 storing software is sometimes referred to as firmware. The POST program 1250 examines hardware within the computer module 1201 to ensure proper functioning and typically checks the processor 1205, the memory 1234 (1209, 1206), and a basic input-output systems software (BIOS) module 1235, also typically stored in the ROM 1249, for correct operation. Once the POST program 1250 has run successfully, the BIOS 1235 activates the hard disk drive 1210 of FIG. 12A. Activation of the hard disk drive 1210 causes a bootstrap loader program 1252 that is resident on the hard disk drive 1210 to execute via the processor 1205. This loads an operating system 1253 into the RAM memory 1206, upon which the operating system 1253 commences operation. The operating system 1253 is a system level application, executable by the processor 1205, to fulfil various high level functions, including processor management, memory management, device management, storage management, software application interface, and generic user interface.

The operating system 1253 manages the memory 1234 (1209, 1206) to ensure that each process or application running on the computer module 1201 has sufficient memory in which to execute without colliding with memory allocated to another process. Furthermore, the different types of memory available in the system 1200 of FIG. 12A must be used properly so that each process can run effectively. Accordingly, the aggregated memory 1234 is not intended to illustrate how particular segments of memory are allocated (unless otherwise stated), but rather to provide a general view of the memory accessible by the computer system 1200 and how such is used.

As shown in FIG. 12B, the processor 1205 includes a number of functional modules including a control unit 1239, an arithmetic logic unit (ALU) 1240, and a local or internal memory 1248, sometimes called a cache memory. The cache memory 1248 typically includes a number of storage registers 1244-1246 in a register section. One or more internal busses 1241 functionally interconnect these functional modules. The processor 1205 typically also has one or more interfaces 1242 for communicating with external devices via the system bus 1204, using a connection 1218. The memory 1234 is coupled to the bus 1204 using a connection 1219.

The application program 1233 includes a sequence of instructions 1231 that may include conditional branch and loop instructions. The program 1233 may also include data 1232 which is used in execution of the program 1233. The instructions 1231 and the data 1232 are stored in memory locations 1228, 1229, 1230 and 1235, 1236, 1237, respectively. Depending upon the relative size of the instructions 1231 and the memory locations 1228-1230, a particular instruction may be stored in a single memory location as depicted by the instruction shown in the memory location 1230. Alternately, an instruction may be segmented into a number of parts each of which is stored in a separate memory location, as depicted by the instruction segments shown in the memory locations 1228 and 1229.

In general, the processor 1205 is given a set of instructions which are executed therein. The processor 1205 waits for a subsequent input, to which the processor 1205 reacts to by executing another set of instructions. Each input may be provided from one or more of a number of sources, including data generated by one or more of the input devices 1202, 1203, data received from an external source across one of the networks 1220, 1202, data retrieved from one of the storage devices 1206, 1209 or data retrieved from a storage medium 1225 inserted into the corresponding reader 1212, all depicted in FIG. 12A. The execution of a set of the instructions may in some cases result in output of data. Execution may also involve storing data or variables to the memory 1234.

The disclosed RAMABS arrangements use input variables 1254, which are stored in the memory 1234 in corresponding memory locations 1255, 1256, 1257. The RAMABS arrangements produce output variables 1261, which are stored in the memory 1234 in corresponding memory locations 1262, 1263, 1264. Intermediate variables 1258 may be stored in memory locations 1259, 1260, 1266 and 1267.

Referring to the processor 1205 of FIG. 12B, the registers 1244, 1245, 1246, the arithmetic logic unit (ALU) 1240, and the control unit 1239 work together to perform sequences of micro-operations needed to perform "fetch, decode, and execute" cycles for every instruction in the instruction set making up the program 1233. Each fetch, decode, and execute cycle comprises:

a fetch operation, which fetches or reads an instruction 1231 from a memory location 1228, 1229, 1230;

a decode operation in which the control unit 1239 determines which instruction has been fetched; and an execute operation in which the control unit 1239 and/or the ALU 1240 execute the instruction.

Thereafter, a further fetch, decode, and execute cycle for the next instruction may be executed. Similarly, a store cycle may be performed by which the control unit 1239 stores or writes a value to a memory location 1232.

Each step or sub-process in the processes of FIGS. 1-5, 8, 9, 13 and 17 is associated with one or more segments of the program 1233 and is performed by the register section 1244, 1245, 1247, the ALU 1240, and the control unit 1239 in the processor 1205 working together to perform the fetch, decode, and execute cycles for every instruction in the instruction set for the noted segments of the program 1233.

The RAMABS method may alternatively be implemented in dedicated hardware such as one or more integrated circuits performing the RAMABS functions or sub functions. Such dedicated hardware may include graphic processors, digital signal processors, or one or more microprocessors and associated memories.

RAMABS Arrangement 1

FIG. 1 is a schematic flow diagram illustrating a method 100 for determining the preferred scheduling and memory allocation schemes for a CNN process such as 1303 (see 101) targeting a particular accelerator SoC hardware platform such as 1314 (see 110), and subsequently optionally implementing and executing the CNN process on that hardware.

The process takes as input: (i) a CNN process 101 (see 1303 for example) that implements the required overall application for the system, (ii) a set of predefined scheduling schemes 102 (see 1308 for example) that can be applied to layers of the CNN, and (iii) a set of memory constraints 103, such as number of PUs and the size of on-chip memory for the PUs, where the on-chip memory for the PUs can be configured as a mix of on-chip shared memory such as 1310 and PU specific local memory such as 1315, 1320.

Figure 2:
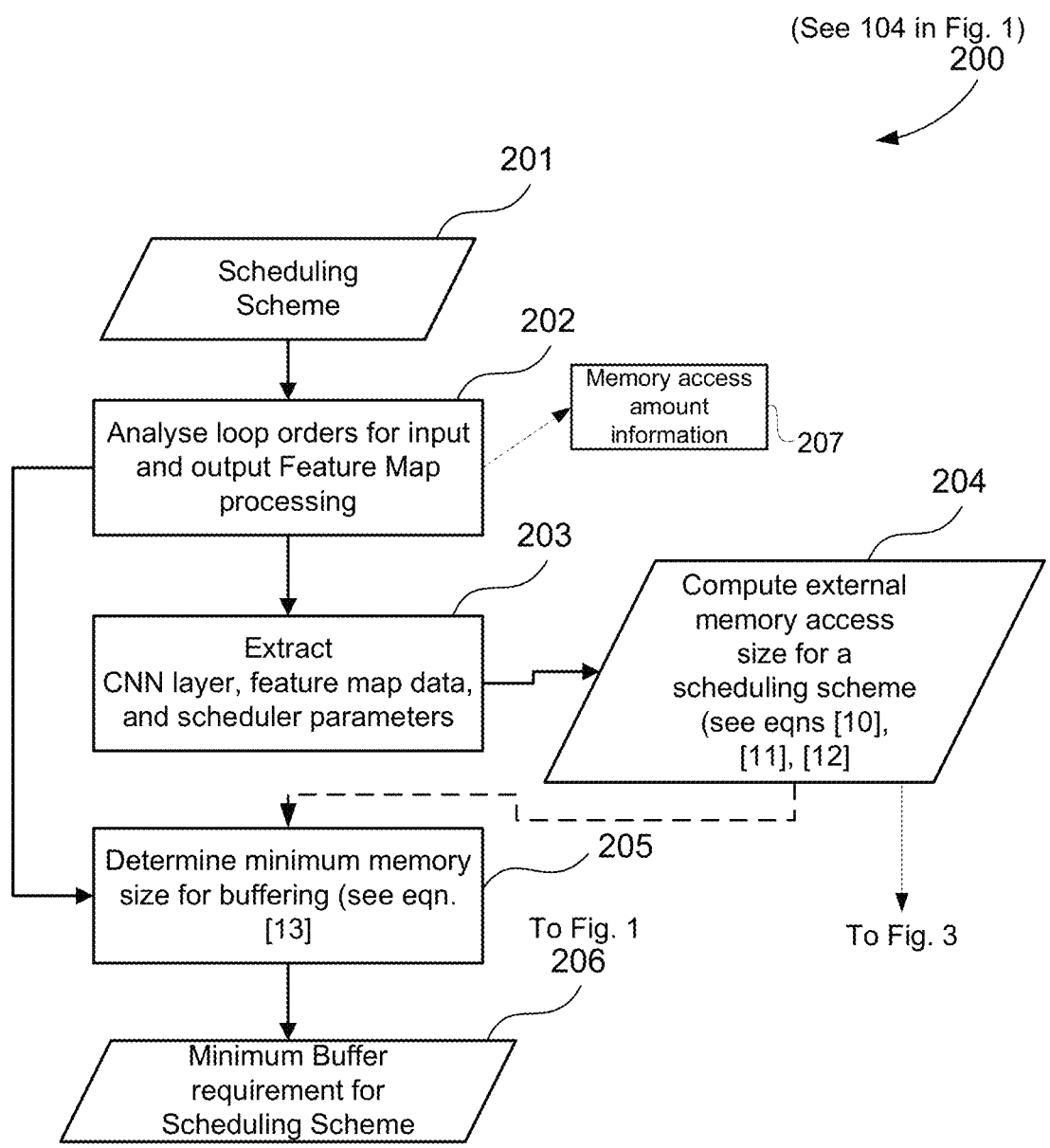
FIG. 2 is a schematic flow diagram depicting an example of a method to analyse a scheduling scheme to extract data reusability information and the minimum on-chip memory size requirement.
Figure 3:
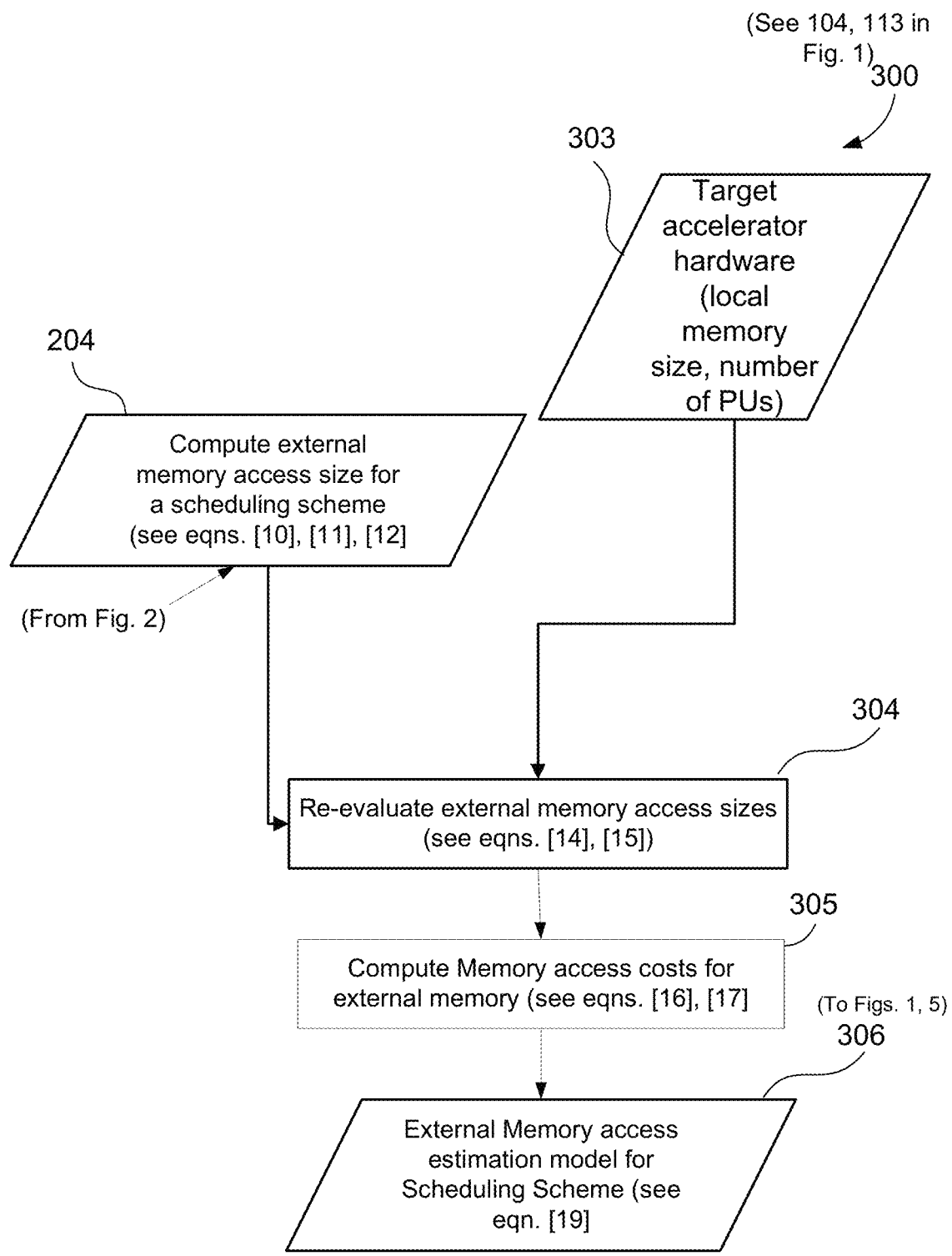
FIG. 3 is a schematic flow diagram depicting an example of a method to build an estimation model for the external memory accesses generated by a scheduling scheme.

A step 104, performed by the processor 1205 executing the software program 1233 and described hereinafter in more detail with reference to FIGS. 2 and 3, is repeated for each of the scheduling schemes in the set 102 of scheduling schemes in order to determine an external memory access estimation model 306 (also referred to as external memory access estimation information) for each scheduling scheme. These models 306 are determined through an analysis of the memory access patterns of the loop arrangements in the scheduling schemes as they implement one layer of the CNN process. The loop arrangements determine the order of processing input FMs and output FMs. The external memory access estimation model 306 for each scheduling scheme describes the total external memory access cost (measured in units of bytes) as a function (see equation [19] of the on-chip memory allocation and the CNN layer parameters, for a given target accelerator SoC). At this step, the scheduling scheme is also analysed for determining the minimum on-chip memory space required 206.

Processes 200 and 300, described hereinafter in relation to FIG. 2 and FIG. 3 respectively, can be executed in sequence to implement the step 104. These sequential processes 200 and 300 in the step 104 are repeated for all the scheduling schemes 102 given as input to process 100.

Returning to FIG. 1, a following step 113, performed by the processor 1205 executing the software program 1233, selects a preferred optimal or close to optimal scheduling scheme 508 and a best memory allocation 413 (which is one memory allocation in a set 107 of information defining the best scheduling scheme and the best memory allocation per layer), as described hereinafter in more detail with reference to FIGS. 3, 4 and 5, for each layer in the CNN process 1303. A different best scheduling scheme and on-chip memory allocation 107 may be selected by the step 113 for each layer. Applying the set 107 of best scheduling schemes and associated memory allocations per layer results in a reduced number, or close to a minimum number, or a minimum number, of external memory accesses in the final implementation of the CNN process (eg 1303) on the target accelerator SoC hardware 110 (also see 1314 in FIG. 13). The selection process 113 is also efficient, providing greatly reduced design time and time to market.

The selection process at step 113 takes information from the memory constraints 103, from the target accelerator hardware 110 and from layer information in the CNN process 101 and applies that information to the external memory access estimation models 306 received from the step 104, allowing an improved or optimal or close to optimal scheduling scheme and memory allocation to be chosen efficiently for each layer of the CNN. The step 113 consists of two sub-steps, 400 and 500, described hereinafter in more detail with reference to FIGS. 4 and 5 respectively.

At the step 400, performed by the processor 1205 executing the software program 1233 and described hereinafter in more detail with reference to FIG. 4, an efficient method is used to determine the optimal or close to optimal on-chip memory allocation 413 for a particular scheduling scheme for a particular CNN layer running in the target accelerator hardware SoC with the corresponding size of on-chip memory.

At the step 500, performed by the processor 1205 executing the software program 1233 and described hereinafter in more detail with reference to FIG. 5, a scheduling scheme 508 is selected for each CNN layer, the selected scheduling scheme reducing or minimising the external memory access cost for that layer. This set of scheduling scheme selections for each CNN layer reduces or minimises the overall external memory access cost for the CNN implementation. The selection of a scheduling scheme is based on the optimal on-chip memory allocation selected at the step 400 and the relevant external memory access estimation model 306. Hence a best scheduling scheme and memory allocation 107 is selected for each CNN layer.

A following optional step 109, performed by the processor 1205 executing the software program 1233, programs the controller on the target accelerator hardware SoC 110 using software code which includes the CNN process 101 and instructions corresponding to the preferred scheduling scheme determined for each layer 500 and memory allocation determined for each scheduling scheme 400.

A following optional step 111, performed by the processor 1205 executing the software program 1233, executes the software code (comprising the CNN process 101 and instructions corresponding to the preferred scheduling scheme determined for each layer 500 and memory allocation determined for each scheduling scheme 400) on the target accelerator hardware SoC. The software is distributed across the controller 603, the PUs 605, 610, 606, . . . , 611 and the DMA 608, as required to implement the selected scheduling schemes and memory allocations.

FIG. 2 is a schematic flow diagram illustrating an example of a method 200 to analyse a scheduling scheme 201 (which is a member of the set of scheduling schemes 102, 1308) in order to extract CNN layer, feature map data and scheduler properties 203 and compute external memory access size for each scheduling scheme 204 (Equations [11]-[13]), this information describing the extent to which data can be reused by a sequence of processing loops in a schedule without additional memory accesses and the minimum on-chip memory size requirement 206).

An initial step 202, performed by the processor 1205 executing the software program 1233, analyses the scheduling scheme 201 to determine relevant memory access information 207. As noted, the scheduling scheme 201 is one of the set of scheduling schemes 102. A scheduling scheme for a CNN consists of a set of nested for-loops that read and write the input and output FMs for a CNN layer, and sometimes the scheduling scheme 201 may include required memory management software instructions. The ordering of the loops determines the sequence of access to input and output FMs, and this in turn determines how many memory accesses are required to process the FMs. The memory access information 207 is made up of size (in bytes) of memory accesses required to process the FMs. A following step 203, performed by the processor 1205 executing the software program 1233, extracts CNN layer parameters (such as number of nodes, kernel size, stride size), feature map data (such as input image size e.g. 200×200×3 pixel) and scheduler properties (such as loop order), and step 204 expresses the results of this analysis in the form of mathematical equations (ie mathematical relationships expressed by equations [10] to [12], or alternately equations {19] and [20]), in terms of memory access volume and CNN layer parameters (as described hereinafter in more detail with reference to FIGS. 3 and 4). Loop order may be independent of the operation (such as do_conv, do_sum, do_conv_ and_sum) contained within the scheduling scheme. Determining an optimal scheduling scheme and memory allocation depends on the loop order and the operation within the scheduling scheme.

Mathematical formulation (204) (equations [10]-[12]) which is used to estimate the number of external memory accesses in a CNN layer 1304/1304/1305 for the user input data 1302 is now described. Applying process 200 on Scheduling_Scheme_One( ) (ie 801) for CNN process 1303 following parameters are extracted 203 for each layer: number of output FM (ofm), output FM size (ofm_size), number of input FM (ifm), size of input FM (ifm_size), loop order. Sizes (in bytes) of external write accesses and read accesses are formulated 204 as shown in equations [10], [11] and [12]. They constitute examples of reusability analysis equations. Equation [10] computes total number of output data writes size in bytes and equation [11] computes total number of input FM data read size in bytes by the scheduler 800 for a layer l. Equations [10] and [11] represent maximum required memory access sizes required by the scheduler 800 assuming 0 bytes of on-chip memory 1310 in hardware accelerator 1314 and disregarding kernel data read sizes. Similarly, kernel weight data read size can be expressed by equation [12].

$$\text{data } ofm \text{write size}_l = ofm_l \times ofm\_size_l \qquad [10]$$

$$\text{data } ifm \text{read size}_l = ifm_l \times ifm\_size_l \times ofm_l \qquad [11]$$

$$\text{weight data read size}_l = k\_size_l \times U_l \times ifm_l \times ofm_l \qquad [12]$$

where:
l—layer l∈L e.g. 1305
$ofm_l$—the number of output FM in layer l
$ofm\_size_l$—size of the output FM (in bytes) in layer l
$ifm_l$—the number of input FM in layer l
$ifm\_size_l$—size of the input FM (in bytes) in layer l
$k\_size_l$—kernel size (in bytes) in layer l
$U_l$—Number of nodes in layer l The values $ofm_l$, $ofm\_size_l$, $ifm_l$ and $ifm\_size_l$ are parameters for each CNN layer e.g. 1305, these CNN layer parameters depend on the input FM data and CNN network defined by the user. The above equations [10], [11] and [12] describe the situation where data is always read and written from/to external memory. However, some of the output and input FMs can be stored in local memory, such as 1310 of a given hardware accelerator 1314, when such local memories are available. External read/write accesses can be reduced by storing some input/output or both FM data in the local memory 1310. Say, ifm_m number of input FM data and ofm_n number of output FM data can be stored in local memory, such as 1310, and reused.

A following step 205, performed by the processor 1205 executing the software program 1233, determines the minimum buffer requirement 206 for the scheduling scheme (as expressed by equation [13]). The minimum buffer requirement needs to accommodate on-chip memory for CNN kernel weights and for input data and output data during calculations, as shown in FIG. 10. The minimum buffer requirement is determined by analysis of the CNN process parameters and the scheduling scheme 201.

To further explain the processes of determining the memory access information 207, Scheduling_Scheme_2( ) (ie 901—see FIG. 9) is used an example. In this example, output FMs are dealt with in the outer most for-loop 902. This results in complete generation of the current set of output FMs. Once these output FM are produced, they are never used again for the current layer, therefore only $ofm_l \times ofm\_size_l$, where $ofm_l$ is the total number of output FM in layer l and $ofm\_size_l$ is the size an output FM (in bytes) in layer l, bytes of writes are required to write back all the output FMs. On the other hand, input FM are accessed inside nested for-loop 903 (indexed by variables j). Once loaded from external memory, each input FM is only used once for each output FM. This means that input FMs are read from memory $ifm_l \times ifm\_size_l \times ofm_l \times (1/num\_pu)$ times, where $ifm_l$ is the number of input FM, $ifm\_size_l$ is the input FM size (in bytes) and num_pu is the number of PU in the target SoC system 1314. Note that the outer for-loop 902 index is incremented in step size of num_pu which explains the (1/num_pu) in the reusability analysis for input FMs.

To explain the process of determining minimum buffer size 206, Scheduling_Scheme_2( ) (ie 901) is used as an example. To hide the latency of loading data required for the next operation, the required data is often pre-loaded (also known as prefetching) in the background to the current operation. In the example scheme, num_pu number of output FMs are processed in parallel. Therefore, a buffer space of $ofm_l \times ofm\_size_l \times num\_pu$ is required to store the current set of output FMs being processed. Buffer size may be double to further improve performance. Similarly, only one input FM is processed at a given time. Within the current input FM, only a sub-part of input FM of size $k\_h_l \times in\_x_l \times inb_l$ (bytes), is required, where symbol legends are described in Table 1. In the example scheme 2, a buffer size of $k\_size_l \times num\_pu$ bytes are required for layer l, where $k\_size_l$ is the layer l kernel size and num_pu is the number of PU in layer l. To summarize, the minimum buffer space required is the sum of temporary output FM data storage, convolution kernel weights and kernel height size of input FM data expressed by the following relationship:

$$\text{mini buffer size}_l = (ofm_l \times ofm\_size_l \times num\_pu) + (k\_h_l \times in\_x_l \times inb_l + s_l \times in\_x_l \times inb_l) + (k\_size_l \times num\_pu) \qquad [13]$$

where,
$ofm_l$—number of output FM in layer l
$ofm\_size_l$—output FM size in layer l (in bytes)
$ifm_1$—number of input FM in layer l
$ifm\_size_l$—input FM size (in bytes) in layer l
$inb_l$—input feature map element size in bytes in layer l
num_pu—number of PU in the target SoC system 1314
$k\_h_l$—kernel height size in number of rows in layer l
$k\_size_l$—kernel size in bytes in layer l
$s_l$—stride size in number of rows or number columns in layer l FIG. 3. is a schematic flow diagram of a method 300 for performing operations required to build the external memory access model 306 (see equations [19] and [20]) for a particular scheduling scheme. The process 300 receives the information 204 (ie equations [10] and [11], noting that [12] is omitted for the time being since it relates only to kernel weights) relating to reusability analysis from the process 200 shown in FIG. 2. The process starts at a step 303, performed by the processor 1205 executing the software program 1233, which receives information 110 about the target SoC architecture 601, 1314, for example, number of PU 1311, on-chip memory 1310, 1315 sizes, single shared memory or distributed shared memory. Hardware accelerator 1314 on-chip memory size information received in 303 is applied in equations formulated (Eqn. [10], [11]) in step 204 producing new set of equations in step 304 (Eqn. [14], [15]).

Equations [10] can be rewritten as equation [14] taking into consideration of the output FM data storage in the local memory and equations [11] can be rewritten as equation [15] taking into consideration of the input FM data storage in the local memory as described in step 304 of FIG. 3. Equation [14] shows size of data write access to external memory 1309 when some output FM data are store locally in the local memory, such as 1310. Similarly, equation [15] shows size of data read access from external memory 1309 when some input FM data are store locally in the local memory, such as 1310. Typically, kernel data in a given layer l is small compared with input and out FM data sizes. They are read once and stored in the local memory, such as 1310, for reuse. Hence, the effects of kernel data reads are ignored to simplify descriptions. Kernel weight data for a layer l is the product of single kernel weight data size (k_size) and the number of nodes in layer l (Ni) expressed as $k\_size_l \times N_l$.

$$ext\_ofm\_wr\_size_l = (ofm_l - ofm\_n_l) \times ofm\_size_l \quad [14]$$

$$ext\_ifm\_rd\_size_l = (ifm_l - ifm\_nm_l) \times ifm\_size_l \times ofm_l \quad [15]$$

where:

l—layer l e.g. 1305 ext_ofm_wr_size$_l$—total output FM data write size to external memory in layer l ext_ifm_wr_size$_l$—total input FM data read size from external memory in layer l ofm$_l$—the number of output FM in layer l ofm_size$_l$—size of the output FM (in bytes) in layer l ifm$_l$—the number of input FM in layer l ifm_size$_l$—size of the input FM (in bytes) in layer l ifm_m$_l$—the number of input FM stored in on-chip memory in layer l ofm_n$_l$—the number of output FM stored in on-chip memory in layer l Equations formulated in step 304 (ie (Eqn. [14], [15])) is used in step 305 (to produce Equations [16] and [17]), which is performed by the processor 1205 executing the software program 1233, to form the memory access cost estimation model 306 (which is expressed as equation [19]) for the particular scheduling scheme. The information produced in 305 is the cost of writing to external memory and reading from external memory.

External memory access cost is one of the key performance indicators of a CNN hardware accelerator. Typical memory access cost is measured in time taken to read/write data from external memory. One of the commonly used time unit is latency in clock cycles. For example, one read transaction of 256 bytes may take around 400 clock cycles in some system. Therefore, memory access cost of 256 bytes of data from external memory is 400 clock cycles. In this disclosure, variable rdc and wrc are used to refer to read latency cost and write latency cost per byte of read/write transaction respectively. Therefore, total write access cost can be expressed as a product of external memory write access size and write latency cost as expressed in equation [16]. Similarly, total read access cost can be expressed as a product of external memory read access size and read latency cost as expressed in equation [17].

$$\text{total write access cost}_l = ext\_ofm\_wr\_size_l \times wrc \quad [16]$$

$$\text{total read access cost}_l = ext\_ifm\_rd\_size_l \times rdc \quad [17]$$

where:

ext_ofm_wr_size$_l$—size of output feature map write to the external memory in layer l (from equation [14])

ext_ifm_rd_size$_l$—size of input feature map read from the external memory in layer l (from equation [15])

wrc—average cost of writing data to external memory per byte rdc—average cost of reading data from external memory per byte Now total external memory access cost is computed by summing external memory costs for input feature map data access, output feature map data access and kernel data access for all the CNN layers as shown in equation [18].

$$\text{External memory cost} = \Sigma_{l=1}^{M} \text{input } FM \text{ data access cost}_l + \Sigma_{l=1}^{M} \text{output } FM \text{ data access cost}_l + \Sigma_{l=1}^{M} \text{kernel weight access cost}_l \quad [18]$$

where,

M is the number of CNN layers l∈{1 . . . M} is a layer input FM data access cost$_l$—input FM data access cost of layer l output FM data access$_l$—output FM data access cost of layer l kernel weight access cost$_l$—kernel weight access cost of layer l The equation [18] above constitutes the memory access estimation model 306 generated for the scheduling scheme 201.

Now described is an optimal or near optimal method for determining the best memory allocation 413. As discussed earlier, the programmer is responsible for allocating the shared memory between input and output FMs of the layer currently being processed. The reusability analysis of the scheduling scheme is used along with hardware parameters to determine the memory allocation 413 that leads to minimal external memory accesses.

Figure 4:
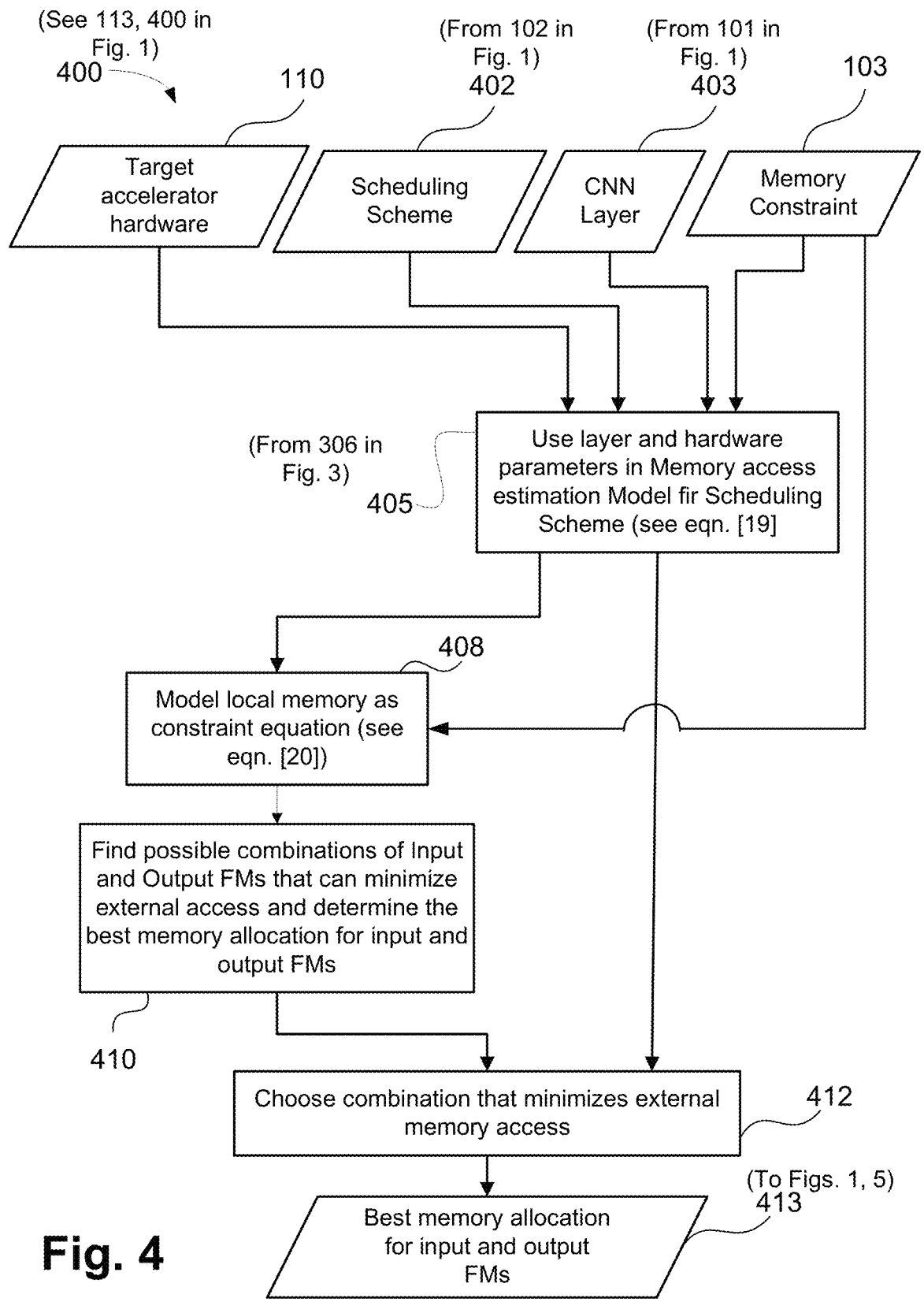
FIG. 4 is a schematic flow diagram depicting an example of a method to determine the best memory allocation for a scheduling scheme when applied to a CNN layer.

FIG. 4 is a schematic flow diagram illustrating an example of a method 400 to determine the optimal memory allocation 413 for a scheduling scheme when applied to a CNN layer. The method 400 operates using the parameters of a particular CNN layer 403, (the CNN layer 403 being one layer of the CNN 101 in question) a particular scheduling scheme 402, (the scheduling scheme 402 being one schedule from the set 102 of schedules in question), the target accelerator hardware 110, and the corresponding on-chip memory constraint 103 for the PUs in the SoC 110 in question.

The method 400 determines the lowest memory for each of the possible schedules for the particular layer in question. A step 507 (see FIG. 5) then chooses the lowest of these as the "best scheduler".

A step 405, performed by the processor 1205 executing the software program 1233, formulates the equation [19] by adding equations [16] and [17] for the external memory access estimation model 306 as a linear memory access function (ie relationship) 405 of the number of input FMs and output FMs that can be stored in on-chip memory, such as 1310, as follows (equation [19]):

$$\text{total memory access cost}_l = \gamma_l - \alpha_l \times ifm\_m_l - \beta_l \times ofm\_n_l \quad [19]$$

where:
$\gamma_l = ofm_l \times ofm\_size_l \times wrc + ifm_l \times ifm\_size_l \times ofm_l \times rdc$
$\alpha_l = ifm\_size_l \times ofm_l \times rdc$
$\beta_l = ofm\_size_l \times wrc$
l—layer l∈L e.g. 1305
ext_ofm_wr_size$_l$—total output FM data write size to external memory in layer l
ext_ifm_wr_size$_l$—total input FM data read size from external memory in layer l
ofm$_l$—the number of output FM in layer l
ofm_size$_l$—size of the output FM (in bytes) in layer l
ifm$_l$—the number of input FM in layer l
ifm_size$_l$—size of the input FM (in bytes) in layer l
ifm_m$_l$—the number of input FM stored in on-chip memory in layer l
ofm_n$_l$—the number of output FM stored in on-chip memory in layer l
wrc—average cost of writing data to external memory per byte
rdc—average cost of reading data from external memory per byte
where α, β and γ are constant values which are determined by the parameters of the particular CNN layer 403, the particular scheduling scheme 402, and the target accelerator hardware 110 and input data 1302.

A following step 408, performed by the processor 1205 executing the software program 1233, uses the on-chip memory constraint 103 for the PUs, which is inherent in the design of the target accelerator hardware SoC 110, to model the capacity of on-chip memory with respect to the number of input FMs and output FMs required to be in memory (described hereinafter in more detail with reference to the constraint depicted in FIG. 11) thereby forming the constraint inequality equation [20]. Equation [20] checks that on-chip memory size is greater than or equal to the sum of the input feature map data size in on-chip memory, output feature map data size in on-chip memory, kernel weight data size in on-chip memory and minimum buffer sizes. It ensures that the total data intended to store in on-chip memory does not exceed on-chip memory capacity.

$$LM_{size} \geq ifm_{m_l} \times ifm\_size_l + ofm_{n_l} \times ofm\_size_l + kw_l + min\_buf_l \quad [20]$$

where:
$LM_{size}$—On-chip memory size constraint
ifm$_{m_l}$—number of layer l's input feature maps stored in on-chip memory
ifm_size$_l$—layer l input feature map size
ofm$_{n_l}$—number of layer l's output feature maps stored in on-chip memory
ofm_size$_l$—layer l output feature map size
kw$_l$—allocated space for layer l kernel weights
min_buf$_l$—minimum buffer required in layer l
where min_buf is the minimum on-chip memory size requirement 206 determined at the step 205 for the particular scheduling scheme.

Note that the inequality in [20] above can result in different feasible combinations of ifm$_{m_l}$ and ofm$_{n_l}$. For example, assume that the sizes of input and output FMs are the same and there is enough space available in the local memory to store 50 FMs. This can accommodate 10 input FMs and 40 output FMs, or 25 input FMs and 25 output FMs, and so on. The real challenge is to identify which combination of input and output FMs stored in local memory results in the minimum external memory cost. Enumerating all possible combinations of local memory allocation for each CNN layer and schedule combination is potentially prohibitive. Therefore a more simple method to determine the best combination is disclosed below.

Figure 20:
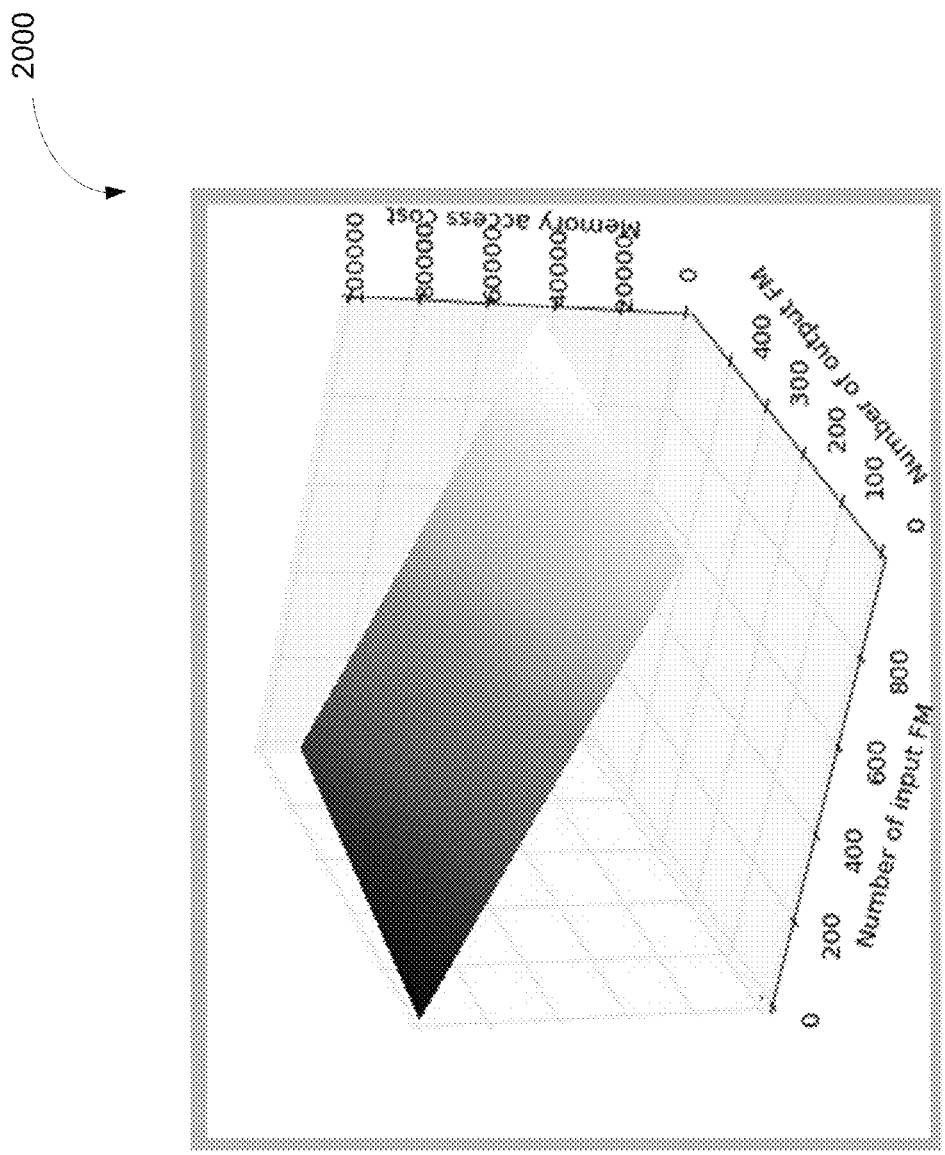
FIG. 20 shows a visualisation of total memory access cost.

Often, size of on-chip memory, such as 1310, is constrained at design time. A following step 410, performed by the processor 1205 executing the software program 1233, finds possible combinations of ifm$_{m_l}$ and ofm$_{n_l}$ that satisfy conditions set forth in equation [20] which have the potential to provide the lowest external memory access cost (equation [19]) for the particular CNN layer 403, the particular scheduling scheme 402, and the particular local memory constraint 103. The equation [19] and the inequality [20] can be visualised as 2-D plane in a 3-D space (FIG. 20). The goal is to minimise the value of the total memory access cost in equation [19] satisfying constraint set forth in equation [20]. Any know optimisation method, in step 412, can be applied to find optimal values of the number of input feature map in SM (ifm_m$_l$) and the number of output feature map in SM (ofm_n$_l$) in equation [19] to obtain optimal memory allocation for input and output FMs 413.

Figure 5:
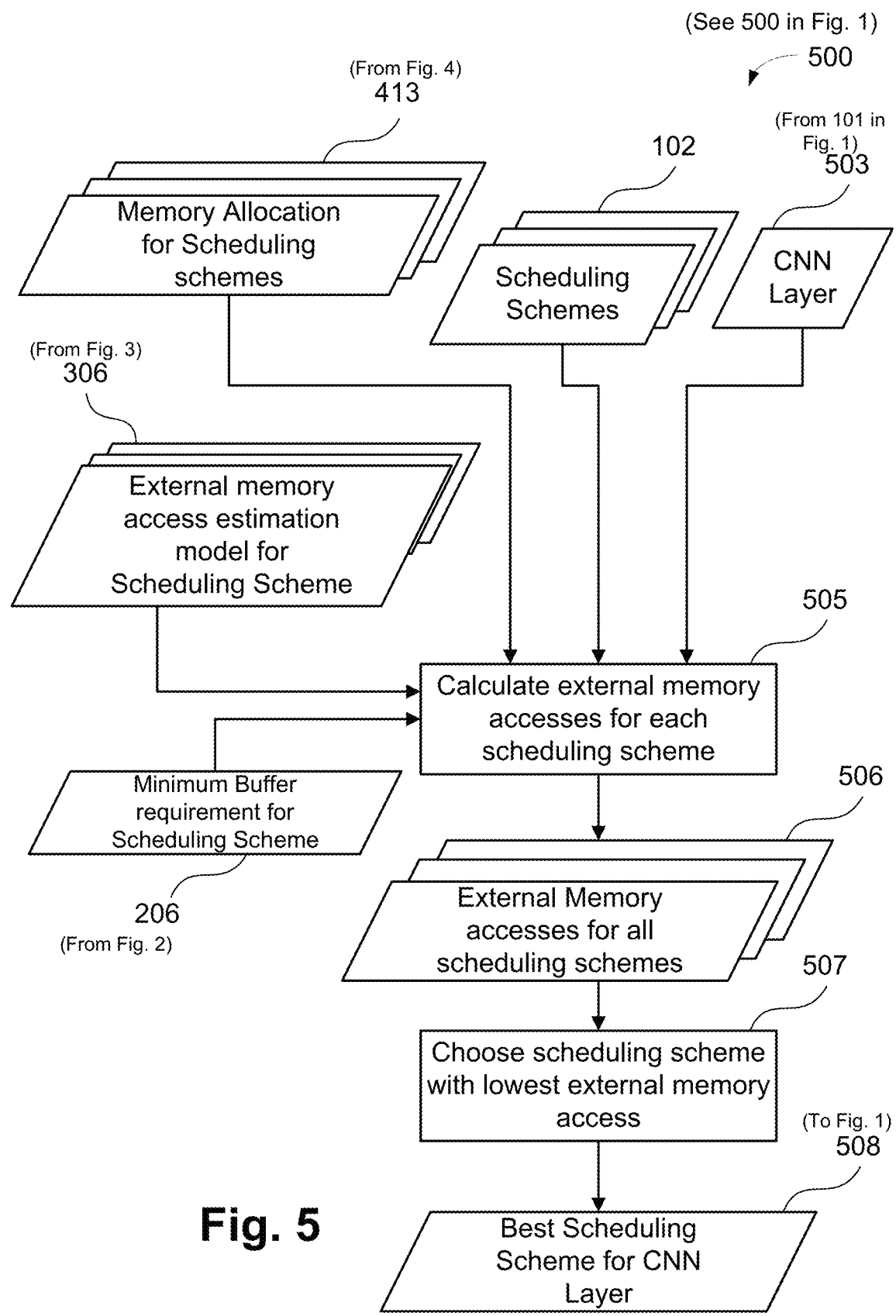
FIG. 5 is a schematic flow diagram depicting an example of a method to find an appropriate scheduling scheme and memory allocation for a CNN layer.

FIG. 5 is a schematic flow diagram illustrating an example of a method 500 to find an appropriate scheduling scheme and memory allocation for a CNN layer. The method 500 operates using the parameters of a particular CNN layer 503.

A step 505, performed by the processor 1205 executing the software program 1233, for a given CNN layer 503, calculates external memory accesses for each scheduling scheme using memory allocation determined for the scheduling scheme (413 from FIG. 4), external memory access estimation model for the scheduling scheme (306 from FIG. 3) and minimum buffer requirement for the scheduling scheme (206 from FIG. 2). The step 505 further determines the external memory access cost 506 (measured in terms of external memory accesses) for all scheduling schemes 102.

A following step 507, performed by the processor 1205 executing the software program 1233, selects the scheduling scheme with the lowest determined external memory cost 506 (the scheduling scheme having lowest value for eqn [19], when eqn [20] constraint is applied) as the best scheduling scheme 508 for the CNN Layer 503. The corresponding best memory allocation 413 for that best scheduling scheme 508 is also selected for the implementation of the CNN layer 503.

Figure 14:
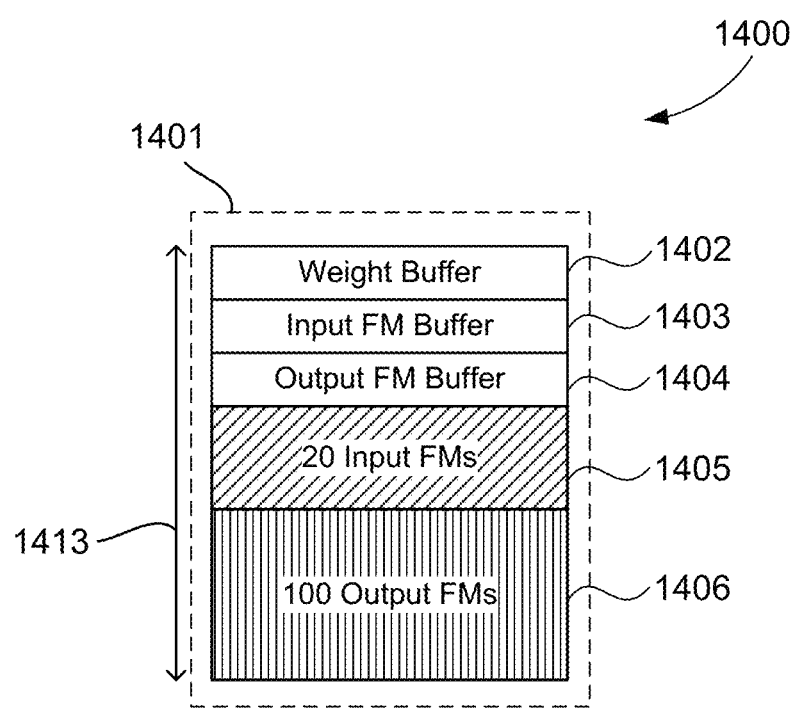
FIG. 14 illustrates a block of on-chip memory in the SoC, with a fixed memory size, at the end of the execution of a current CNN layer.
Figure 15:
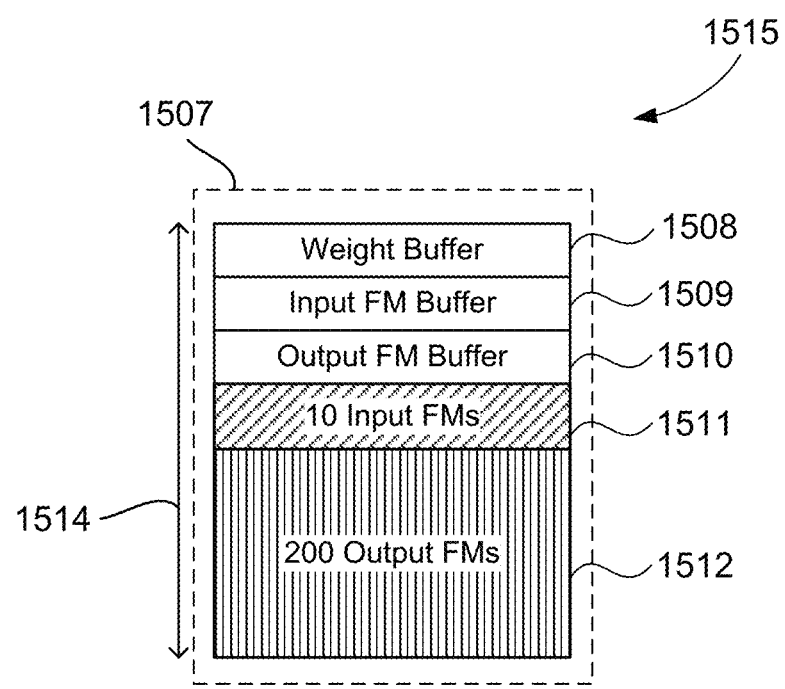
FIG. 15 illustrates the same physical block of on-chip memory depicted in FIG. 14, at the start of execution of the next CNN layer.

FIGS. 14 and 15 show examples 1400 and 1515 of where the on-chip memory allocations are different between two consecutive CNN layers. Typically, the on-chip memory configuration at the completion of the execution of one CNN layer will not be the on-chip memory configuration required for the next CNN layer. The two layers will commonly have different memory allocations between weights, input FMs and output FMs, and the input FMs that are stored in on-chip memory at the end of one layer's execution are not required for the subsequent layer. The output FMs at the end of execution of one CNN layer can constitute the input FMs of the next CNN layer.

In FIG. 14 item 1401 illustrates the block of on-chip memory in the SoC, with a fixed memory size 1413, at the end of the execution of a current CNN layer. For the aforementioned current CNN layer, the memory is allocated within the block between a weight buffer 1402, an input FM buffer 1403, an output FM buffer 1404, twenty input FMs 1405, and one hundred output FMs 1406.

In FIG. 15, item 1507 illustrates the same physical block of on-chip memory with the same fixed memory size 1514

(ie the memory size 1413 is the same as the memory size 1514), at the start of execution of the next CNN layer. The next CNN layer requires a different memory allocation within the block. For the next CNN layer, the next weight buffer 1508 may have a different size to the current weight buffer 1402, due to differences in the CNN parameters for the two layers. Similarly the input FM buffer 1509 and the output FM buffer 1510 for the next CNN layer may have different sizes to the current input FM buffer 1403 and current output FM buffer 1404. Also, the allocation of the remaining memory to input FMs and output FMs (1511 and 1512) for the next CNN layer may differ from the corresponding allocations (1405 and 1406) for the current CNN layer.

Figure 18:
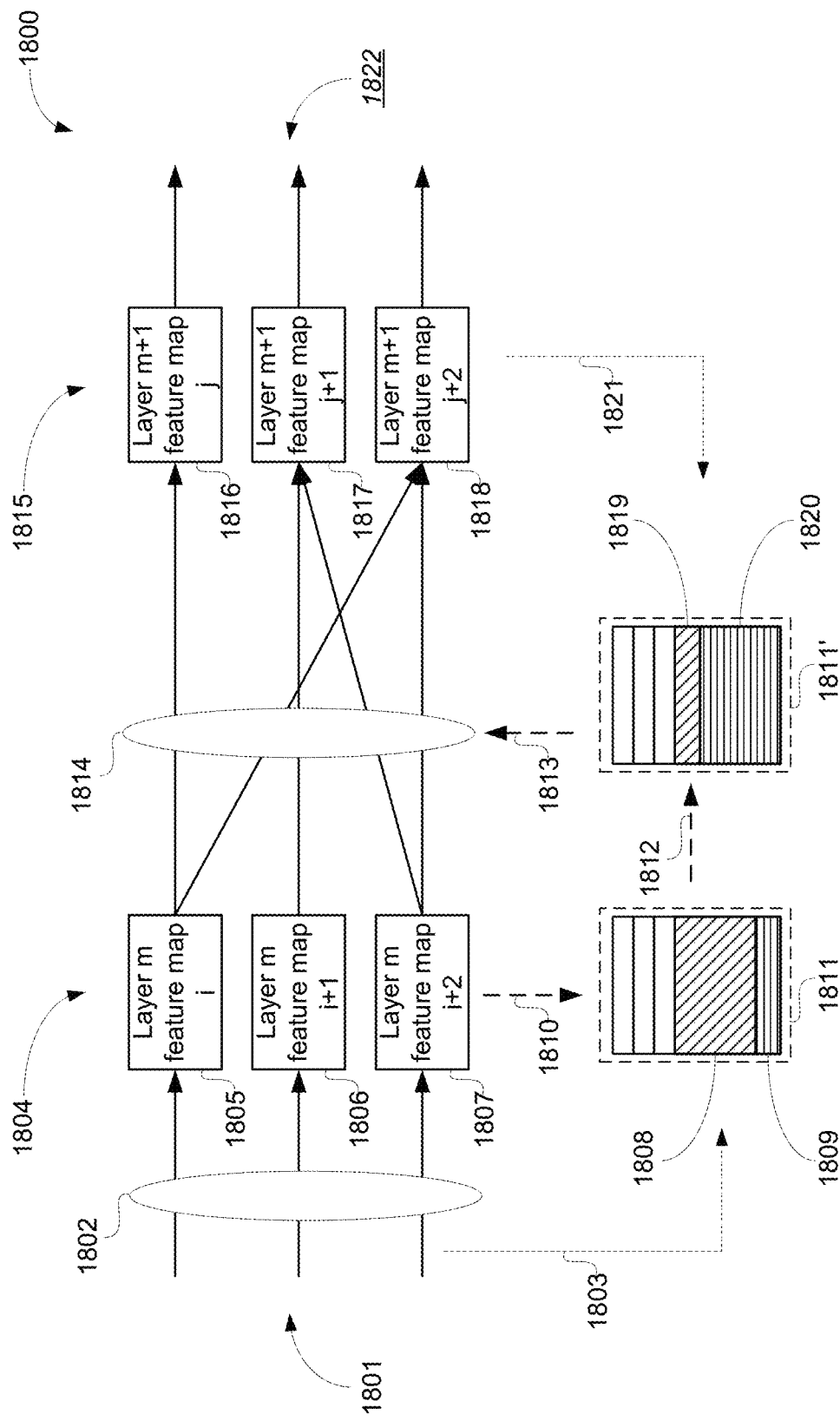
FIG. 18 depicts an example of how the RAMABS arrangement manages local memory in a CNN.

FIG. 18 depicts an example 1800 of RAMABS operation. FIG. 18 shows an on-chip memory 1811 (eg 1310, 1320) in a CNN as well as a current layer 1804 and a subsequent layer 1815, which respectively represent layer m feature maps 1805, 1806, 1807 and layer m+1 feature maps 1816, 1817, and 1818.

Input FMs 1801, which are stored in a memory region 1808 of the on-chip memory 1811, are processed by an SoC 1802 (such as 1314). PUs (such as 1311) of the SoC 1802 process the input FMs 1801 as directed by a scheduling scheme (such as 1322), to produce the output FMs 1805, 1806 and 1807. The output FMs 1805, 1806 and 1807 are stored in a memory region 1809 of the on-chip memory 1811. The cross hatched areas 1808 and 1809 in the on-chip memory 1811 represent regions of the on-chip memory 1811 allocated to input FMs and output FMs respectively (see FIGS. 14 and 15) by the step 400 in FIG. 1.

The memory allocations 1808, 1809 of the on-chip memory 1811 are reallocated (see 400, 413 in FIG. 1) as depicted by a dashed arrow 1812 to allocate a region 1819 for input FMs and a region 1820 for output FMs in the on-chip memory 1811'. The on-chip memory 1811' is the same memory as the on-chip memory 1811 however the allocation areas 1819 and 1820 for input FMs and output FMs respectively in the on-chip memory 1811' may not be identical to the allocation areas 1808 and 1809 for input FMs and output FMs respectively in the on-chip memory 1811.

The aforementioned reallocation process 400 depicted by the dashed arrow 1812 ensures that the memory allocations 1819 and 1820 are suitable for processing by the SoC 1814 which then forms the subsequent output FMs 1816, 1817 and 1818 as directed by a scheduling scheme (such as 1322), to produce output FMs 1816, 1817 and 1818.

The process of choosing the optimal memory allocation for each combination of CNN layer and scheduling scheme can be performed in O(M×N) steps where M and N are the total number of CNN layers and total number of scheduling schemes, respectively. Search of an optimal or near optimal scheduler and memory map require N iterations, where N is the number schedulers. There the total number of search for M layers is M×N. Therefore, the overall time complexity of the disclosed RAMABS framework is O(M×N) ( ).

It is also noted that according to one aspect of the present disclosure, there is provided a method of configuring a multi-accelerator SoC to execute a CNN process, the method comprising the steps of: (i) receiving a plurality of scheduling schemes each specifying the sequence of processing of input and output data of CNN layers; (ii) receiving architecture parameters such as number of PUs and on-chip memory size, etc., of the target SoC; (iii) performing reuse analysis of the plurality of scheduling schemes and building an estimation model for calculating external memory accesses; (iv) determining the best allocation of memory for the plurality of scheduling schemes for all CNN layers; (v) determining a scheduling scheme for a layer based on the already determined memory allocation and external memory estimation model; (vi) evaluating the memory allocation and scheduling schemes assigned to previous and current CNN layers, to determine the need for additional computational and/or memory operations required to keep local memory map in a state expected by the current CNN layer.

INDUSTRIAL APPLICABILITY

The arrangements described are applicable to the computer and data processing industries and particularly for the image processing industry.

The foregoing describes only some embodiments of the present invention, and modifications and/or changes can be made thereto without departing from the scope and spirit of the invention, the embodiments being illustrative and not restrictive.

The invention claimed is:

1. A method of configuring a multi-processing-unit System-on-Chip (SoC) to execute a Convolutional Neural Network (CNN) process comprising a plurality of CNN layers, the method comprising the steps of:

receiving a plurality of predetermined schedules each specifying an order of processing steps for processing input feature maps (input FMs) input to a CNN layer of the CNN process executing on the multi-processing-unit SoC and for processing output feature maps (output FMs) output from the CNN layer of the CNN process executing on the multi-processing-unit SoC, wherein processing input FMs and processing output FMs are performed by processing units of the multi-processing-unit SoC;

for each predetermined schedule of the plurality of predetermined schedules:

determining memory access amount information describing how many memory accesses are required to process the input FMs and the output FMs of the CNN layer of the CNN process executing on the multi-processing-unit SoC;

expressing the determined memory access amount information as one or more relationships describing an extent to which data can be reused by the processing steps of the predetermined schedule without requiring additional memory accesses;

combining the one or more relationships with a cost of writing to an external memory and a cost of reading from the external memory, to form memory access information describing a total external memory access cost required to implement the predetermined schedule;

determining a first memory allocation for an on-chip memory of the SoC for the input FMs and the output FMs dependent upon the determined memory access amount information and a size of the on-chip memory of the SoC;

determining, dependent upon the determined memory access amount information and the first memory allocation determined for the on-chip memory of the SoC for each predetermined schedule of the plurality of predetermined schedules;

a predetermined schedule from the plurality of predetermined schedules which minimises the memory access amount information of the external memory access for the CNN layer of the CNN process executing on the multi-processing-unit SoC; and
a first memory allocation associated with the predetermined schedule; and
applying the predetermined schedule and the first memory allocation associated with the predetermined schedule to the CNN layer of the CNN process executing on the multi-processing-unit SoC.

2. A method according to claim 1, wherein the processing steps in the plurality of predetermined schedules comprise nested processing loops and the step of determining the memory access amount information is dependent upon an order of the nested processing loops.

3. A method according to claim 1, wherein the cost of writing to the external memory and the cost of reading from the external memory is dependent upon the multi-processing-unit SoC.

4. A method according to claim 3, further comprising the step of, if a second memory allocation is not different to the first memory allocation, using the first memory allocation as the second memory allocation.

5. A method according to claim 1, wherein the step of determining the first memory allocation for the on-chip memory of the SoC comprises, in relation to a specific CNN layer of the CNN process executing on the multi-processing-unit SoC and a specific schedule, formulating the memory access amount information as a linear memory access relationship dependent upon a weighted value of the number of input FMs required to be in the on-chip memory of the SoC, and a weighted value of the number of output FMs required to be in the on-chip memory of the SoC.

6. A method according to claim 5, further comprising the steps of:
determining a constraint for the on-chip memory of the SoC with respect to (i) a number of input FMs required to be in the on-chip memory of the SoC, (ii) a number of output FMs required to be in the on-chip memory of the SoC, and (iii) a minimum buffer size required by the specific schedule;
combining the linear memory access relationship and the constraint for the on-chip memory of the SoC to determine two on-chip memory allocation combinations of (i) the number of input FMs required to be in the on-chip memory of the SoC and (ii) the number of output FMs required to be in the on-chip memory of the SoC; and
selecting an on-chip memory allocation combination which has the lower memory access amount information to thereby determine the first memory allocation for the on-chip memory of the SoC.

7. A method according to claim 5, wherein the weighted value of the number of input FMs is dependent upon a size of the input FMs, a number of output FMs produced by processing the input FMs, and a read cost per byte to read from the external memory.

8. A method according to claim 5, wherein the weighted value of the number of output FMs is dependent upon a size of the output FMs and a write cost per byte to write to the external memory.

9. A method according to claim 1, wherein the step of determining, dependent upon the determined memory access amount information and the first memory allocation determined for the on-chip memory of the SoC for each predetermined schedule of the plurality of predetermined schedules, the predetermined schedule from the plurality of predetermined schedules which minimises the memory access amount information of the external memory access for the CNN layer of the CNN process executing on the multi-processing-unit SoC, and the first memory allocation associated with the predetermined schedule comprises the steps of:
selecting, for each of the plurality of predetermined schedules, a corresponding best memory allocation dependent upon parameters of the CNN layer of the CNN process executing on the multi-processing-unit SoC;
determining a number of external memory accesses for each of the plurality of predetermined schedules depending upon the memory access amount information and the corresponding best memory allocation; and
selecting the predetermined schedule from the plurality of predetermined schedules with the lowest determined number of external memory accesses and the corresponding best memory allocation for the predetermined schedule from the plurality of predetermined schedules and the CNN layer of the CNN process executing on the multi-processing-unit SoC.

10. A method according to claim 1, wherein the memory access amount information is dependent upon a read cost per byte to read from the external memory and a write cost per byte to write to the external memory.

11. A method according to claim 1, wherein the first memory allocation for the on-chip memory of the SoC assigns, during performance of the method for a specified CNN layer of the CNN process executing on the multi-processing-unit SoC, a weight buffer for storing values of CNN kernel weights used in CNN convolutions, an input FM buffer to store input FMs, and an output FM buffer to store output FMs.

12. A system for configuring a multi-processing-unit System-on-Chip (SoC) to execute a Convolutional Neural Network (CNN) process comprising a plurality of CNN layers, the system comprising:
one or more memories storing executable computer readable code; and
one or more processors executing the executable computer readable code in order to perform the steps of:
receiving a plurality of predetermined schedules each specifying an order of processing steps for processing input feature maps (input FMs) input to a CNN layer of the CNN process executing on the multi-processing-unit SoC and for processing output feature maps (output FMs) output from the CNN layer of the CNN process executing on the multi-processing-unit SoC, wherein processing input FMs and processing output FMs are performed by processing units of the multi-processing-unit SoC;
for each predetermined schedule of the plurality of predetermined schedules:
determining memory access amount information describing how many memory accesses are required to process the input FMs and the output FMs of the CNN layer of the CNN process executing on the multi-processing-unit SoC;
expressing the determined memory access amount information as one or more relationships describing an extent to which data can be reused by the processing steps of the predetermined schedule without requiring additional memory accesses;
combining the one or more relationships with a cost of writing to an external memory and a cost of reading from the external memory, to form memory access information describing a total external memory access cost required to implement the predetermined schedule;

determining a first memory allocation for an on-chip memory of the SoC for the input FMs and the output FMs dependent upon the determined memory access amount information and a size of the on-chip memory of the SoC;

determining, dependent upon the determined memory access amount information and the first memory allocation determined for the on-chip memory of the SoC for each predetermined schedule of the plurality of predetermined schedules;

a predetermined schedule from the plurality of predetermined schedules which minimises the memory access amount information of the external memory access for the CNN layer of the CNN process executing on the multi-processing-unit SoC; and a first memory allocation associated with the predetermined schedule; and applying the predetermined schedule and the first memory allocation associated with the predetermined schedule to the CNN layer of the CNN process executing on the multi-processing-unit SoC.

13. A non-transitory computer readable medium comprising one or more memories storing executable computer readable code for directing one or more processors to configure a multi-processing-unit System-on-Chip (SoC) to execute a Convolutional Neural Network (CNN) process comprising a plurality of CNN layers, by performing a method comprising the steps of:

receiving a plurality of predetermined schedules each specifying an order of processing steps for processing input feature maps (input FMs) input to a CNN layer of the CNN process executing on the multi-processing-unit SoC and for processing output feature maps (output FMs) output from the CNN layer of the CNN process executing on the multi-processing-unit SoC, wherein processing input FMs and processing output FMs are performed by processing units of the multi-processing-unit SoC;

for each predetermined schedule of the plurality of predetermined schedules:

determining memory access amount information describing how many memory accesses are required to process the input FMs and the output FMs of the CNN layer of the CNN process executing on the multi-processing-unit SoC;

expressing the determined memory access amount information as one or more relationships describing an extent to which data can be reused by the processing steps of the predetermined schedule without requiring additional memory accesses;

combining the one or more relationships with a cost of writing to an external memory and a cost of reading from the external memory, to form memory access information describing a total external memory access cost required to implement the predetermined schedule;

determining a first memory allocation for an on-chip memory of the SoC for the input FMs and the output FMs dependent upon the determined memory access amount information and a size of the on-chip memory of the SoC;

determining, dependent upon the determined memory access amount information and the first memory allocation determined for the on-chip memory of the SoC for each predetermined schedule of the plurality of predetermined schedules;

a predetermined schedule from the plurality of predetermined schedules which minimises the memory access amount information of the external memory access for the CNN layer of the CNN process executing on the multi-processing-unit SoC; and a first memory allocation associated with the predetermined schedule; and applying the predetermined schedule and the first memory allocation associated with the predetermined schedule to the CNN layer of the CNN process executing on the multi-processing-unit SoC.

14. A method of configuring a memory for storing input and output feature maps for a layer of a Convolutional Neural Network (CNN) process executing on a multi-processing-unit System-on-Chip (SoC), the method comprising the steps of:

determining, for the layer of the CNN process executing on the multi-processing-unit SoC, a best schedule from a plurality of predetermined schedules, wherein each predetermined schedule of the plurality of predetermined schedules describes an order of processing input and output feature maps of the layer of the CNN process executing on the multi-processing-unit SoC, and wherein the best schedule is a predetermined schedule of the plurality of predetermined schedules with the lowest amount of external memory access for the layer of the CNN process executing on the multi-processing-unit SoC;

for each predetermined schedule of the plurality of predetermined schedules:

determining an estimation model for an amount of external memory access required to implement the predetermined schedule, wherein the determined estimation model for the amount of external memory access is based on weights for the input and output feature maps of the layer of the CNN process executing on the multi-processing-unit SoC, and the order of processing the input and output feature maps of the layer of the CNN process executing on the multi-processing-unit SoC; and determining a memory allocation for the input and output feature maps of the layer of the CNN process executing on the multi-processing-unit SoC according to the determined estimation model for the amount of external memory access and a size of an on-chip memory of the multi-processing-unit SoC; and applying the best schedule of the plurality of predetermined schedules to the layer of the CNN process executing on the multi-processing-unit SoC, wherein the best schedule of the plurality of predetermined schedules is selected according to the determined memory allocation for the input and output feature maps of the layer of the CNN process executing on the multi-processing-unit SoC.

15. An apparatus for configuring a memory for storing input and output feature maps for a layer of a Convolutional Neural Network (CNN) process executing on a multi-processing-unit System-on-Chip (SoC), the apparatus comprising:

a processor; and a non-transitory computer readable medium storing a computer executable program for directing the processor to perform a method comprising the steps of:

determining, for the layer of the CNN process executing on the multi-processing-unit SoC, a best schedule from a plurality of predetermined schedules, wherein each predetermined schedule of the plurality of predetermined schedules describes an order of processing input and output feature maps of the layer of the CNN process executing on the multi-processing-unit SoC, and wherein the best schedule is a predetermined schedule of the plurality of predetermined schedules with the lowest amount of external memory access for the layer of the CNN process executing on the multi-processing-unit SoC;

for each predetermined schedule of the plurality of predetermined schedules:

determining an estimation model for an amount of external memory access required to implement the predetermined schedule, wherein the determined estimation model for the amount of external memory access is based on weights for the input and output feature maps of the layer of the CNN process executing on the multi-processing-unit SoC, and the order of processing the input and output feature maps of the layer of the CNN process executing on the multi-processing-unit SoC; and determining a memory allocation for the input and output feature maps of the layer of the CNN process executing on the multi-processing-unit SoC according to the determined estimation model for the amount of external memory access and a size of an on-chip memory of the multi-processing-unit SoC; and applying the best schedule of the plurality of predetermined schedules to the layer of the CNN process executing on the multi-processing-unit SoC, wherein the best schedule of the plurality of predetermined schedules is selected according to the determined memory allocation for the input and output feature maps of the layer of the CNN process executing on the multi-processing-unit SoC.

16. A non-transitory computer readable medium storing a computer executable program for directing a processor to perform a method for configuring a memory for storing input and output feature maps for a layer of a Convolutional Neural Network (CNN) process executing on a multi-processing-unit System-on-Chip (SoC), the method comprising the steps of:

determining, for the layer of the CNN process executing on the multi-processing-unit SoC, a best schedule from a plurality of predetermined schedules, wherein each predetermined schedule of the plurality of predetermined schedules describes an order of processing input and output feature maps of the layer of the CNN process executing on the multi-processing-unit SoC, and wherein the best schedule is a predetermined schedule of the plurality of predetermined schedules with the lowest amount of external memory access for the layer of the CNN process executing on the multi-processing-unit SoC;

for each predetermined schedule of the plurality of predetermined schedules:

determining an estimation model for an amount of external memory access required to implement the predetermined schedule, wherein the determined estimation model for the amount of external memory access is based on weights for the input and output feature maps of the layer of the CNN process executing on the multi-processing-unit SoC, and the order of processing the input and output feature maps of the layer of the CNN process executing on the multi-processing-unit SoC; and determining a memory allocation for the input and output feature maps of the layer of the CNN process executing on the multi-processing-unit SoC according to the determined estimation model for the amount of external memory access and a size of an on-chip memory of the multi-processing-unit SoC; and applying the best schedule of the plurality of predetermined schedules to the layer of the CNN process executing on the multi-processing-unit SoC, wherein the best schedule of the plurality of predetermined schedules is selected according to the determined memory allocation for the input and output feature maps of the layer of the CNN process executing on the multi-processing-unit SoC.

* * * * *